US010157765B2

(12) United States Patent
Stranzl et al.

(10) Patent No.: US 10,157,765 B2
(45) Date of Patent: Dec. 18, 2018

(54) METHODS FOR PROCESSING A SEMICONDUCTOR WORKPIECE

(71) Applicant: Infineon Technologies AG, Neubiberg (DE)

(72) Inventors: Gudrun Stranzl, Goedersdorf (AT); Martin Zgaga, Rosegg (AT); Rainer Leuschner, Regensburg (DE); Bernhard Goller, Villach (AT); Bernhard Boche, Munich (DE); Manfred Engelhardt, Villach-Landskron (AT); Hermann Wendt, Regensburg (DE); Bernd Noehammer, Villach (AT); Karl Mayer, Villach (AT); Michael Roesner, Villach (AT); Monika Cornelia Voerckel, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/359,620

(22) Filed: Nov. 23, 2016

(65) Prior Publication Data

US 2017/0076970 A1  Mar. 16, 2017

Related U.S. Application Data

(62) Division of application No. 14/088,523, filed on Nov. 25, 2013.

(51) Int. Cl.
*H01L 23/498* (2006.01)
*H01L 21/683* (2006.01)
*H01L 21/283* (2006.01)
*H01L 21/78* (2006.01)
*H01L 21/033* (2006.01)
*H01L 21/285* (2006.01)
(Continued)

(52) U.S. Cl.
CPC ...... *H01L 21/6835* (2013.01); *H01L 21/0331* (2013.01); *H01L 21/283* (2013.01);
(Continued)

(58) Field of Classification Search
CPC ... H01L 2924/13055; H01L 2924/0001; H01L 21/0331; H01L 21/283; H01L 21/2855; H01L 21/304; H01L 21/3065; H01L 21/3081; H01L 21/3086; H01L 21/6835; H01L 21/6836; H01L 21/76895; H01L 21/78; H01L 2221/68327;
(Continued)

(56) References Cited

U.S. PATENT DOCUMENTS 5,904,546 A * 5/1999 Wood .................. H01L 21/78
257/E21.599
6,309,943 B1 * 10/2001 Glenn .................. H01L 21/481
257/E23.179
(Continued)

*Primary Examiner* — Sophia Nguyen
(74) *Attorney, Agent, or Firm* — Viering, Jentschura & Partner MBB

(57) ABSTRACT

Methods for processing a semiconductor workpiece can include providing a semiconductor workpiece that includes one or more kerf regions; forming one or more trenches in the workpiece by removing material from the one or more kerf regions from a first side of the workpiece; mounting the workpiece with the first side to a carrier; thinning the workpiece from a second side of the workpiece; and forming a metallization layer over the second side of the workpiece.

17 Claims, 27 Drawing Sheets

(51) Int. Cl.
  *H01L 21/304* (2006.01)
  *H01L 21/3065* (2006.01)
  *H01L 21/308* (2006.01)
  *H01L 21/768* (2006.01)

(52) U.S. Cl.
  CPC ........ *H01L 21/2855* (2013.01); *H01L 21/304* (2013.01); *H01L 21/3065* (2013.01); *H01L 21/3081* (2013.01); *H01L 21/3086* (2013.01); *H01L 21/6836* (2013.01); *H01L 21/76895* (2013.01); *H01L 21/78* (2013.01); *H01L 2221/6834* (2013.01); *H01L 2221/68327* (2013.01); *H01L 2221/68359* (2013.01); *H01L 2924/12042* (2013.01); *H01L 2924/13055* (2013.01)

(58) Field of Classification Search
  CPC ... H01L 2221/68359; H01L 2221/6834; H01L 2924/0002; H01L 2924/00; H01L 2924/12044; H01L 21/30655; H01L 23/3114; H01L 21/784; H01L 21/0332; H01L 21/314; H01L 21/311; H01L 21/32; H01L 21/467; H01L 21/683; H01L 2221/88327; H01L 2223/5448; H01L 2223/54453; H01L 21/0337; B81C 1/00888; B81C 1/00896; B81C 1/00904; B81C 1/00801
  See application file for complete search history.

(56) References Cited

U.S. PATENT DOCUMENTS

| | | | | |
|---|---|---|---|---|
| 7,052,975 B2* | 5/2006 | Koizumi | H01L 21/78 | 257/E21.599 |
| 7,459,378 B2* | 12/2008 | Genda | B81C 1/00888 | 257/E21.598 |
| 7,678,670 B2* | 3/2010 | Arita | H01L 21/6835 | 257/E21.523 |
| 7,767,551 B2* | 8/2010 | Arita | H01L 21/78 | 438/460 |
| 7,767,554 B2* | 8/2010 | Arita | H01L 21/3043 | 257/E21.238 |
| 7,923,351 B2* | 4/2011 | Arita | H01L 21/78 | 257/E21.602 |
| 8,043,698 B2* | 10/2011 | Morishima | H01L 21/6835 | 428/343 |
| 8,383,436 B2* | 2/2013 | Arita | H01J 37/32082 | 438/113 |
| 8,723,314 B2* | 5/2014 | Su | H01L 21/78 | 257/620 |
| 8,871,613 B2* | 10/2014 | Seddon | H01L 21/78 | 257/620 |
| 9,093,518 B1* | 7/2015 | Lei | H01L 21/6836 | |
| 2002/0037631 A1* | 3/2002 | Mimata | H01L 21/6835 | 438/460 |
| 2003/0001283 A1* | 1/2003 | Kumamoto | H01L 21/563 | 257/778 |
| 2003/0121599 A1* | 7/2003 | Yamamoto | H01L 21/67132 | 156/247 |
| 2004/0147120 A1* | 7/2004 | Rogalli | B24B 7/228 | 438/689 |
| 2007/0184633 A1* | 8/2007 | Yang | B81C 1/00888 | 438/460 |
| 2009/0023295 A1* | 1/2009 | Arita | H01L 21/3065 | 438/710 |
| 2009/0134512 A1* | 5/2009 | Chiang | H01L 21/4842 | 257/723 |
| 2009/0311830 A1* | 12/2009 | Kang | H01L 21/6836 | 438/113 |
| 2010/0022071 A1* | 1/2010 | Arita | H01L 21/3043 | 438/463 |
| 2010/0044873 A1* | 2/2010 | Kameyama | H01L 21/78 | 257/773 |
| 2010/0081235 A1* | 4/2010 | Furumura | G06K 19/07749 | 438/113 |
| 2010/0173474 A1* | 7/2010 | Arita | H01L 21/78 | 438/462 |
| 2010/0227454 A1* | 9/2010 | Dohmae | H01L 21/78 | 438/464 |
| 2010/0248452 A1* | 9/2010 | Saito | C08G 18/672 | 438/464 |
| 2010/0261335 A1* | 10/2010 | Andry | H01L 21/78 | 438/462 |
| 2010/0330780 A1* | 12/2010 | Hwang | C09J 7/02 | 438/464 |
| 2011/0003135 A1* | 1/2011 | Hirao | C09J 4/00 | 428/313.3 |
| 2011/0104483 A1* | 5/2011 | Shinozaki | C08L 33/14 | 428/347 |
| 2011/0312157 A1* | 12/2011 | Lei | H01L 21/78 | 438/462 |
| 2012/0009716 A1* | 1/2012 | Chang | H01L 27/14618 | 438/65 |
| 2012/0034437 A1* | 2/2012 | Puligadda | H01L 21/2007 | 428/212 |
| 2012/0119389 A1* | 5/2012 | Menath | H01L 23/3114 | 257/782 |
| 2012/0211748 A1* | 8/2012 | Miccoli | B23K 26/0057 | 257/52 |
| 2013/0178006 A1* | 7/2013 | Kim | H01L 21/78 | 438/33 |
| 2013/0328195 A1* | 12/2013 | Engelhardt | H01L 21/78 | 257/741 |
| 2014/0017880 A1* | 1/2014 | Lei | H01L 21/78 | 438/462 |
| 2014/0076846 A1* | 3/2014 | Feng | H01L 21/6836 | 216/33 |
| 2014/0197451 A1* | 7/2014 | Chen | H01L 29/7393 | 257/139 |
| 2015/0024575 A1* | 1/2015 | Hu | H01L 23/544 | 438/462 |
| 2015/0064879 A1* | 3/2015 | Engelhardt | H01L 21/78 | 438/464 |
| 2015/0079760 A1* | 3/2015 | Lei | H01L 21/82 | 438/462 |
| 2015/0079761 A1* | 3/2015 | Lei | H01L 21/78 | 438/462 |
| 2015/0108506 A1* | 4/2015 | Zhang | H01L 31/18 | 257/81 |
| 2015/0171036 A1* | 6/2015 | Gowda | H01L 23/49827 | 257/741 |
| 2015/0279739 A1* | 10/2015 | Lei | H01L 21/78 | 438/462 |
| 2015/0279740 A1* | 10/2015 | Roesner | H01L 21/76898 | 438/464 |
| 2015/0333118 A1* | 11/2015 | Eguchi | H01L 29/78 | 257/493 |
| 2016/0042996 A1* | 2/2016 | Yakoo | H01L 21/78 | 438/462 |
| 2016/0099285 A1* | 4/2016 | Kumagai | H01L 27/14607 | 29/25.01 |
| 2016/0104626 A1* | 4/2016 | Nelson | H01L 21/31144 | 438/114 |
| 2016/0141208 A1* | 5/2016 | Joachim | H01L 24/03 | 438/114 |
| 2016/0167358 A1* | 6/2016 | Tang | B05D 1/02 | 156/247 |
| 2016/0254188 A1* | 9/2016 | Priewasser | H01L 21/78 | 438/114 |
| 2016/0358703 A1* | 12/2016 | Kriman | H01F 13/003 | |
| 2017/0076970 A1* | 3/2017 | Stranzl | H01L 21/3081 | |
| 2017/0103908 A1* | 4/2017 | Lew | H01L 21/67092 | |

* cited by examiner

METHODS FOR PROCESSING A SEMICONDUCTOR WORKPIECE

RELATED APPLICATION(S)

This application is a divisional of U.S. patent application Ser. No. 14/088,523, filed on Nov. 25, 2013, the contents of which are hereby incorporated by reference.

TECHNICAL FIELD

Various embodiments relate to methods for processing of semiconductor workpieces.

BACKGROUND

Manufactured semiconductor devices include multiple integrated circuits (ICs), and/or other devices or elements which are formed on a semiconductor wafer before being separated or singulated into individual chips or dies. Generally integrated circuits are located within active areas or regions of the semiconductor wafer. The wafers can include spacing areas or kerf regions that can provide adequate separation between neighboring active or device regions. The semiconductor wafers are typically separated or diced in these spacing areas or kerf regions to form individual semiconductor chips or dies.

Various methods are used for separating a semiconductor wafer or semiconductor workpiece, including, e.g., mechanical sawing, etching, laser dicing, stealth laser dicing, or the like. Some methods may require a relatively large dicing street on a semiconductor wafer and therefore reduce the amount of semiconductor wafer material used for active or device regions. Some separation or singulation methods can also cause damage to a semiconductor wafer, such as, among other things, in the form of sidewall chipping. Thin semiconductor wafers, as well as semiconductor wafers having a backside metallization layer can be particularly susceptible to sidewall chipping.

Further, some separation methods can also damage a semiconductor wafer by causing ridges to form in a semiconductor wafer. These ridges, in turn, can lead to breakage during die pick up. Yet still, some separation methods can cause unwanted changes to a semiconductor wafer, such as, in one example, causing mono crystalline silicon to transform into an amorphous state in an uncontrolled way. In general, many separation or dicing techniques can produce chipped edges in subsequently formed semiconductor chips. The chipped edges reduce the breaking strength of the semiconductor chips.

Thus wafer separation techniques that reduce or minimize the needed spacing regions while also avoiding or reducing damage to the wafers may be desirable.

In a dicing before grinding (DBG) singulation process, wafers may be processed in a preliminary step so that material is removed from kerf regions (sawed, etched, etc.) from a front side, for example, at least up to the depth of a required chip thickness. Subsequently, such wafers may be diced from the back side by means of a grinding process. In DBG methods heretofore, metallizing the back side has not been possible because wafers and/or chips to which a foil or the like has been applied are not mechanically stable enough after grinding in order to be able to be handled. Conventional carrier-technique methods including the use of a rigid carrier and liquid glue are not suitable because the glue cannot be subsequently removed from chipped sidewalls.

Thus DBG like separation techniques that enable, e.g., metallization of a wafer and/or chip back side may be desirable.

SUMMARY

In various embodiments, a method for processing a semiconductor workpiece can include providing a semiconductor workpiece that includes one or more kerf regions; forming one or more trenches in the workpiece by removing material from the one or more kerf regions from a first side of the workpiece; mounting the workpiece with the first side to a carrier; thinning the workpiece from a second side of the workpiece; and forming a metallization layer over the second side of the workpiece after thinning the workpiece.

In various embodiments, a method for processing a semiconductor workpiece can include providing a semiconductor workpiece that includes one or more kerf regions; forming a first mask layer over a first side of the workpiece; patterning the first mask layer to expose the one or more kerf regions; mounting the workpiece with the patterned first mask layer to a carrier; forming a second mask layer over a second side of the workpiece; patterning the second mask layer to expose the one or more kerf regions; etching the one or more kerf regions from the second side of the workpiece to form one or more trenches in the workpiece extending from the second side to the first side of the workpiece; and forming a metallization layer over the second side of the workpiece after etching the one or more kerf regions.

In various embodiments, a method for processing a semiconductor workpiece can include providing a semiconductor workpiece that includes one or more kerf regions; forming a first mask layer over a first side of the workpiece; patterning the first mask layer to expose the one or more kerf regions; mounting the workpiece with the patterned first mask layer to a carrier; forming a second mask layer over a second side of the workpiece; patterning the second mask layer to expose one or more regions of the workpiece adjacent to the one or more kerf regions; forming a metallization layer over the patterned second mask layer and the one or more exposed regions of the workpiece adjacent to the one or more kerf regions; applying a lift-off process to remove the patterned second mask layer and the metallization layer from the one or more kerf regions and form a patterned metallization layer; and etching the one or more kerf regions from the second side of the workpiece to form one or more trenches in the workpiece extending from the second side to the first side of the workpiece.

In various embodiments, a method for processing a semiconductor workpiece can include providing a semiconductor workpiece that includes one or more kerf regions; forming a mask layer over a first side of the workpiece; patterning the mask layer to expose the one or more kerf regions; mounting the workpiece with the patterned mask layer to a carrier; forming a metallization layer over a second side of the workpiece that is opposite the first side; patterning the metallization layer to expose the one or more kerf regions; and etching the one or more kerf regions from the second side of the workpiece to form one or more trenches in the workpiece extending from the second side to the first side of the workpiece.

In various embodiments, a method for processing a semiconductor workpiece can include providing a semiconductor workpiece that includes one or more kerf regions; forming an etch stop layer over a first side of the workpiece; mounting the workpiece with the etch stop layer attached to a carrier; etching the one or more kerf regions from a second side of the workpiece to the etch stop layer to form one or more trenches in the workpiece; and removing one or more sections of the etch stop layer exposed by the one or more trenches, to extend the one or more trenches through to a surface of the etch stop layer facing the carrier.

In various embodiments, a method for processing a semiconductor workpiece can include providing a semiconductor workpiece that includes one or more kerf regions; removing material of the one or more kerf regions from a first side of the workpiece to form one or more trenches in the workpiece; forming an adhesive structure over the first side of the workpiece, wherein the adhesive structure at most partially fills the one or more trenches; mounting the workpiece to a carrier using the adhesive structure; thinning the workpiece from a second side of the workpiece so as to open the one or more trenches; and forming a metallization layer over the second side of the workpiece after thinning the workpiece.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer, "over" a side or surface, may be used to mean that the feature, e.g. the layer, may be formed "directly on", e.g. in direct contact with, the implied side or surface. The word "over", used herein to describe forming a feature, e.g. a layer, "over" a side or surface, may be used to mean that the feature, e.g. the layer, may be formed "indirectly on" the implied side or surface with one or more additional layers being arranged between the implied side or surface and the formed layer.

The term "connection" may include both an indirect "connection" and a direct "connection".

When referring to semiconductor devices, at least two-terminal devices are meant, an example is a diode. Semiconductor devices can also be three-terminal devices such as field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits may include a plurality of integrated devices.

Specific embodiments described herein pertain to, without being limited thereto, methods for processing and dicing semiconductor wafers.

Figure 1:
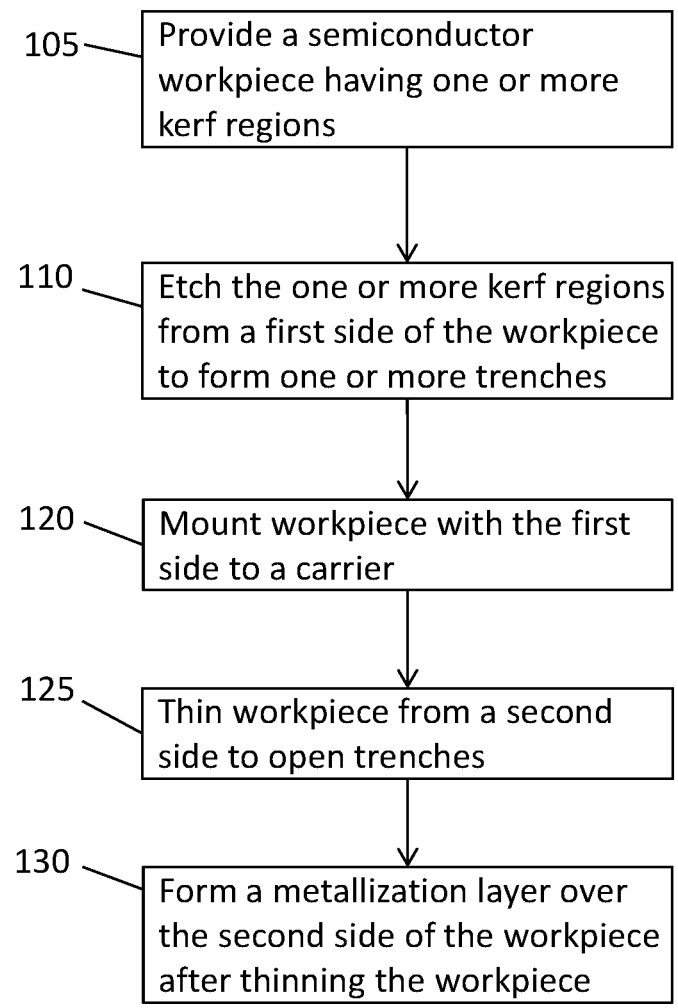
FIG. 1 shows a method for processing a semiconductor workpiece in accordance with various embodiments.
Figure 2A:
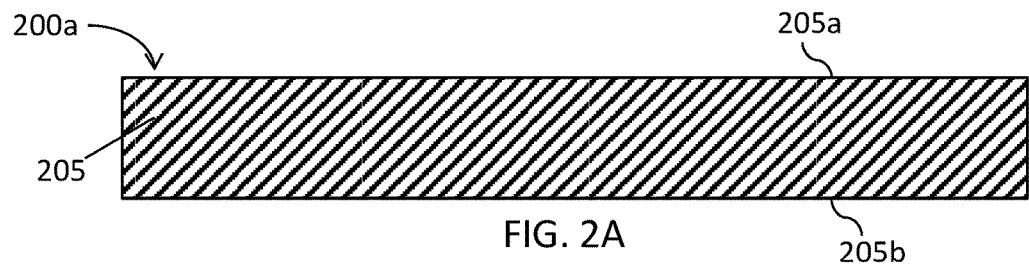
FIGS. 2A-2H illustrate cross-sectional views of semiconductor workpieces in accordance with various embodiments.

FIG. 1 shows according to an exemplary embodiment, a method for processing a semiconductor workpiece. According to the method, at 105, a semiconductor workpiece having one or more kerf regions is provided. The embodiment of FIG. 2A shows a cross-sectional view of a structure 200a, which includes a semiconductor workpiece 205.

In embodiments, a provided semiconductor workpiece may be a semiconductor wafer that can include at least one semiconductor layer. The semiconductor wafer may include one or more other layers, such as other semiconductor layers, insulators, metal layers, etc. that are directly or indirectly attached to the semiconductor layer.

The semiconductor layer(s) or wafer can be made of any suitable semiconductor material. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminum gallium nitride (AlGaN), indium gallium phosphide (InGaPa) or indium gallium arsenide phosphide (In—GaAsP), and binary or ternary II-VI semiconductor materials such as cadmium telluride (CdTe) and mercury cadmium telluride (HgCdTe) to name few.

In accordance with exemplary embodiments, the semiconductor workpiece may include at least one device region or active region. The device region or active region may include one or more semiconductor elements, e.g., one or more integrated circuit elements, e.g., one or more active and/or passive elements such as, for example, one or more diodes, transistors, thyristors, capacitors, inductors, or the like. In accordance with one or more embodiments, the device region or active region may include one or more interconnects, e.g., one or more vias and/or one or more electrically conductive lines. The device region may be disposed over a substrate region of the workpiece. In accordance with exemplary embodiments, one or more device regions of the semiconductor workpiece may be located between and/or adjacent to the kerf regions.

Referring back to FIG. 1, at 110, the one or more kerf regions of the semiconductor workpiece may be etched to form one or more trenches. The trenches may extend at least partially through the workpiece. In embodiments, the trenches can be formed by etching at a first side of the workpiece. In accordance with exemplary embodiments, the trenches can be formed through any suitable etching process, including in one example, plasma etching. Plasma etching may include applying a plasma etchant, e.g., made of any suitable gaseous halogen containing compound e.g., $CF_4$, $SF_6$, $NF_3$, HCl, HBr, $SiF_4$, and the like.

Figure 2B:
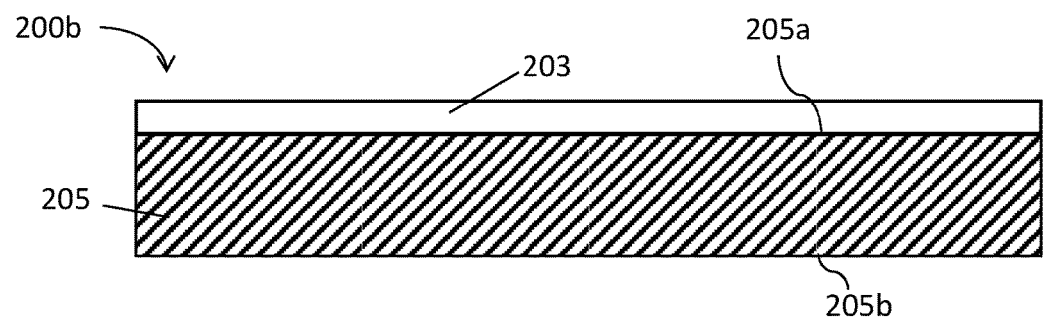
Figure 2C:
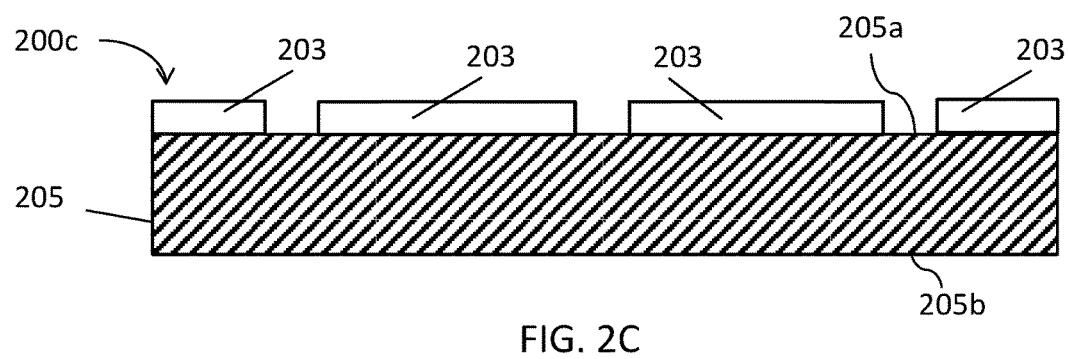

In embodiments, prior to etching, a masking layer 203 may be formed or applied to the first side of the workpiece, as shown in FIG. 2B. The masking layer 203 may be patterned, e.g., using photolithographic techniques, so that the kerf regions are exposed, as shown in FIG. 2C. In embodiments the masking layer 203 may include or may be made of a hard masking material, e.g., an oxide, a nitride, or the like. In one or more embodiments, the masking layer may include or may be made of a photoresist.

Figure 2D:
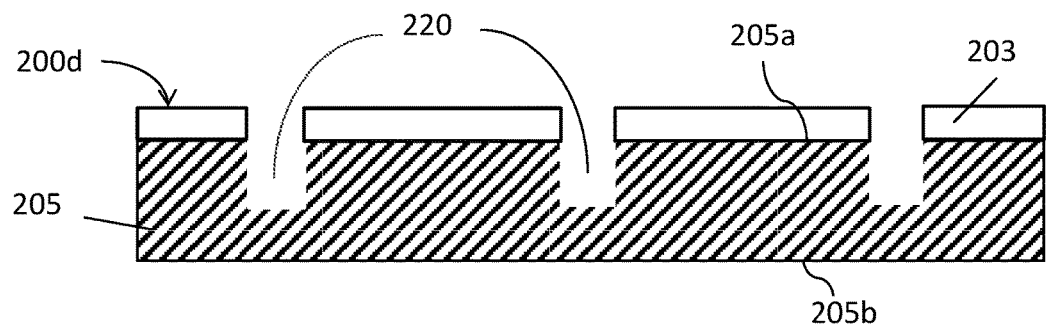
Figure 2E:
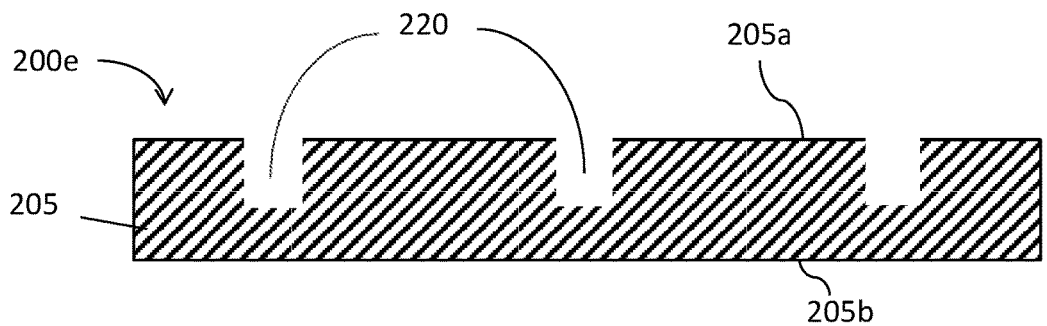

The embodiment of FIG. 2D shows a structure 200d in which the semiconductor workpiece 205 has been etched from a first side 205a of the workpiece 205 to form a plurality of trenches 220. The trenches 220 may be located in the kerf regions of the workpiece 205. As seen in FIG. 2D, the trenches start from the first side 205a (e.g., front side) of the workpiece 205 and extend partially toward but not fully toward a second side 205b (e.g., back side) of the workpiece 205. The workpiece 205 may be etched in the exposed kerf regions using the patterned masking layer 203 as an etch mask. After the etching has been completed, the masking layer 203 may be removed (e.g., using a resist strip process in the case of a photoresist, or any other suitable processes) in one or more embodiments. See FIG. 2E.

Referring back to FIG. 1, after forming the one or more trenches, the workpiece can be mounted with the first side to a carrier, at 120. Mounting the workpiece may include depositing or applying adhesive over the first side of the workpiece and then attaching the workpiece to the carrier. Further, in some embodiments, a foil or any other suitable protective layer, e.g., a film may be applied to the first side of the semiconductor workpiece prior to depositing the adhesive. In this regard, when attaching the workpiece to another element (e.g., carrier), the foil may allow the workpiece to attach and bond to another element but can prevent adhesive (e.g., glue or the like), from entering and/or seeping into the trenches and/or on the sidewalls of the workpiece.

In accordance with exemplary embodiments, the carrier as well as any other carrier described herein may be made out of any suitable material, and may be configured as rigid carrier. For example, the carrier may be can be made out of materials including, glass, graphite, acrylic glass (Poly(m-ethyl methacrylate) (PMMA)), semiconductor material (e.g., silicon), and plastic, to a name a few.

After mounting, the workpiece can be thinned from the second side to open the one or more trenches, at 125. The workpiece or portion thereof can be thinned using any suitable method or technique, such as by grinding, in one example. Thinning the workpiece from the second side can open or extend the trenches through the back surface of the workpiece. In one or more embodiments, the workpiece may be diced, in other words, singulated into individual devices (e.g., chips) by the thinning. In some embodiments, after thinning, the second side of the workpiece may be polished.

Figure 2F:
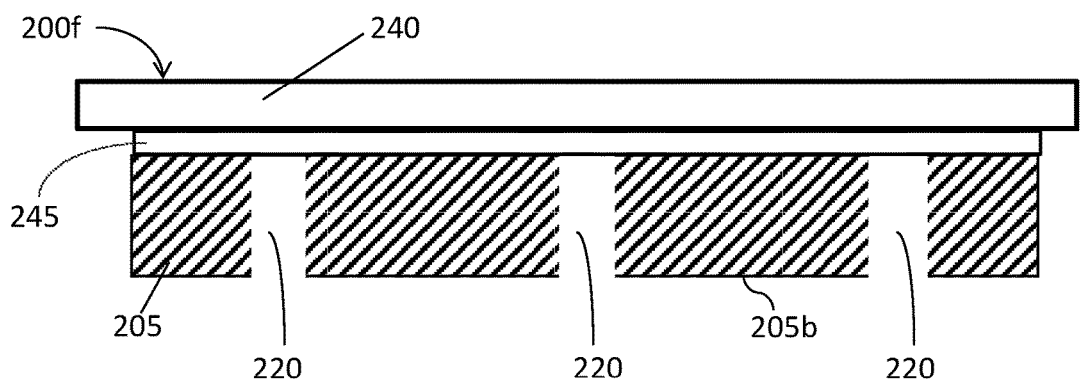

The embodiment of FIG. 2F shows a structure 200f including the workpiece 205 after it has been mounted to a carrier 240 and thinned. The trenches 220 are open from the second side 205b. An adhesive 245 can attach the workpiece 205 to the carrier.

In one or more embodiments, an implantation may be carried out from the second side 205b. In other words, particles, e.g. ions (or dopants) may be implanted into the workpiece 205 (e.g., backside implantation). Alternatively or in addition, there may be one or more other processes that may be carried out.

In FIG. 1, after mounting and thinning (and possibly implanting), a metallization layer can be formed over the second side of the workpiece, at 130. The metallization layer may also be formed at least partially in the trenches, such as on the trench sidewalls, for example.

In accordance with exemplary embodiments, the metallization layer can be formed using any suitable techniques or processes. For example, in an exemplary embodiment, a metallization layer can be formed through a metal sputtering deposition process. In other words, metal can be sputter deposited on the second side of the workpiece to form the metallization layer. In some embodiments, the workpiece, or portions thereof, may be cleaned prior to the metal sputter deposition.

Figure 2G:
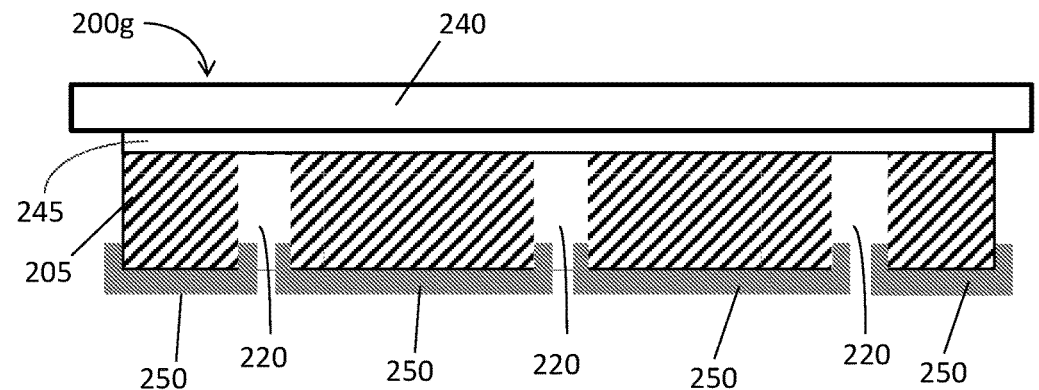

The embodiment of FIG. 2G shows a structure 200g in which the mounted semiconductor workpiece 205 includes a metallization layer 250. The metallization layer 250 extends partially into the one or more trenches 220.

In exemplary embodiments, the semiconductor workpiece or portions thereof may be laminated. For example, the workpiece may be laminated onto a tape. After lamination the first carrier can be demounted or removed from the workpiece.

Figure 2H:
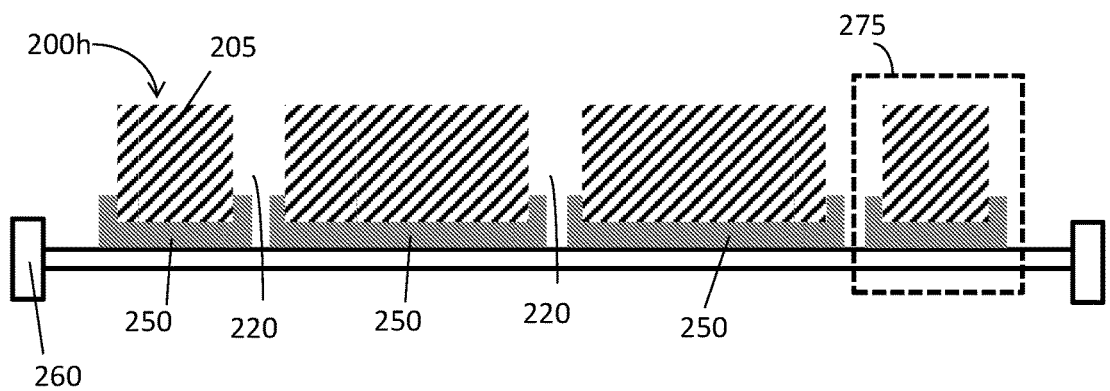

The embodiment of FIG. 2H depicts a structure 200h in which the workpiece 205 has been mounted on a tape 260. As shown the tape 260 attaches to the metallization layer 250. As can be seen in FIG. 2H, a series of individual devices or singulated integrated chips, such as chip 275, are mounted on the tape 260.

In one or more embodiments, after forming the metallization layer, the workpiece, or the individual devices or chips may be further processed. In one exemplary embodiment the workpiece (e.g., devices or chips) can be mounted to an additional carrier. In this regard, the workpiece (e.g., devices or chips) can be mounted with the metallization layer to the additional carrier. The additional carrier may be, for example, a lead frame, or any other suitable carrier.

Figure 3:
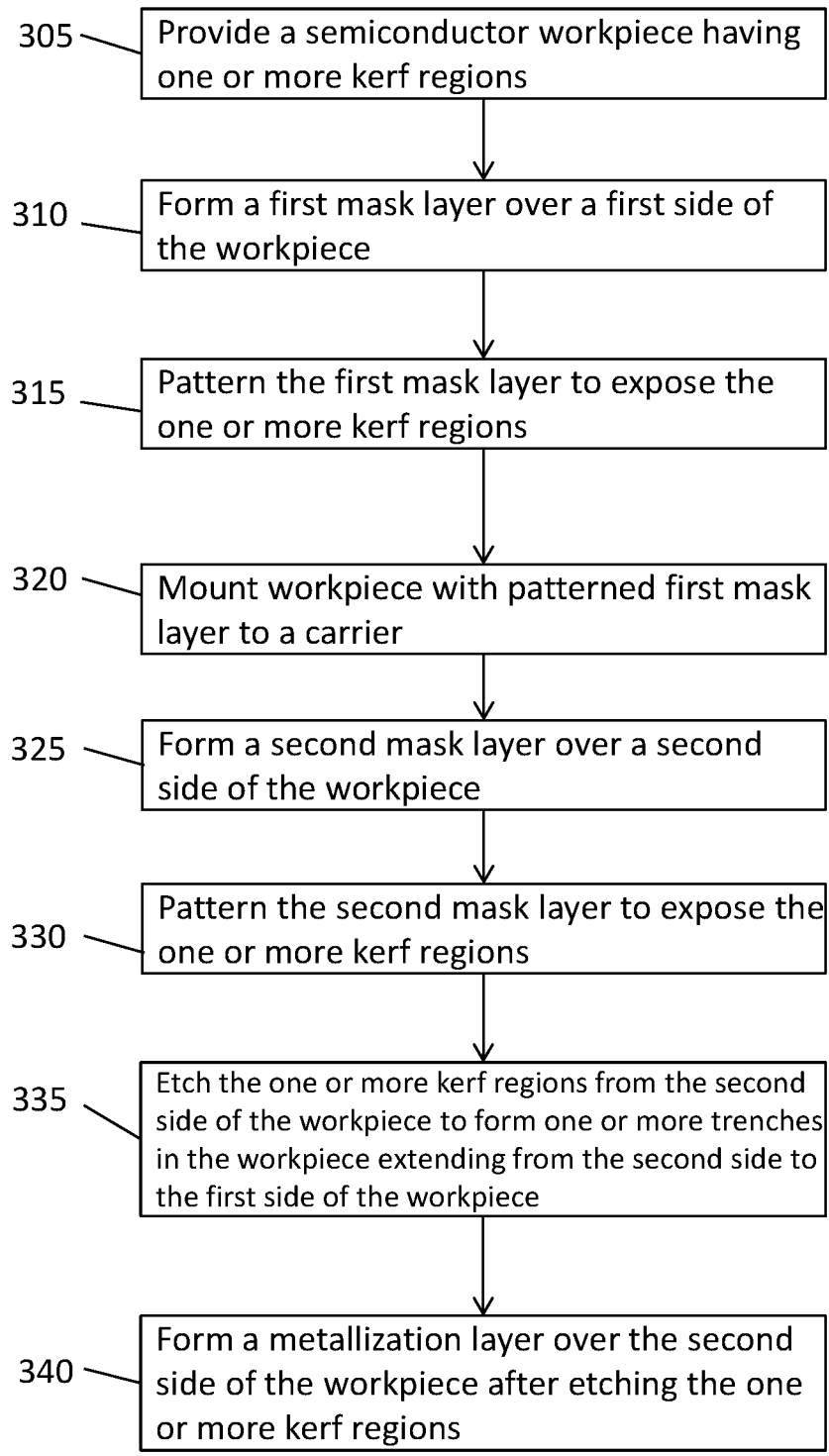
FIG. 3 shows a method for processing a semiconductor workpiece in accordance with various embodiments.

In accordance with exemplary embodiments, FIG. 3 relates to a method for processing a semiconductor workpiece. In the following, aspects of the method of FIG. 3 can be described with reference to FIGS. 4A to 4J.

Figure 4A:
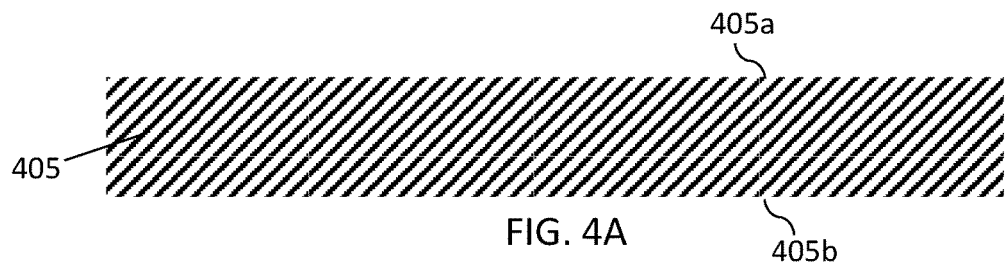
FIGS. 4A-4J illustrate cross-sectional views of semiconductor workpieces in accordance with various embodiments.
Figure 4B:
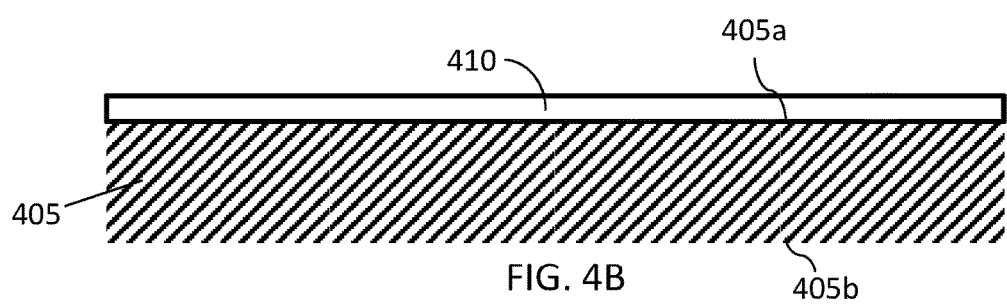

According to exemplary embodiments, at 305 of FIG. 3, a semiconductor workpiece can be provided that has one or more kerf regions. The embodiment of FIG. 4A shows a cross-sectional view of a structure 400a, which includes a semiconductor workpiece 405 having a first side 405a and a second side 405b.

The workpiece can be any workpiece previously described herein. In this regard, the workpiece may be a semiconductor wafer that can include at least one semiconductor layer. The semiconductor wafer may include one or more other semiconductor layers, insulators, metal layers, additional elements, etc. that directly or indirectly attached to the semiconductor layer. The semiconductor layer can be any semiconductor material previously described herein. Further as previously described, and in accordance exemplary embodiments, the semiconductor workpiece may include at least one device region or active region. The device or active region may include one or more semiconductor elements, e.g., one or more integrated circuit elements, e.g., one or more active and/or passive elements such as, for example, one or more diodes, transistors, thryistors, capacitors, inductors, or the like. In accordance with one or more embodiments, the device region or active region may include one or more interconnects, e.g., one or more vias and/or one or more electrically conductive lines. The device region may be disposed over a substrate region of the workpiece. In accordance with exemplary embodiments, one or more device regions of the semiconductor workpiece may be located between and/or adjacent to the kerf regions.

Referring back to FIG. 3, at 310, a first mask layer can be formed over a first side of the workpiece. In embodiments, the first side may be a front side of the workpiece. For example, a structure 400b in the embodiment of FIG. 4B includes a first mask layer 410 that has been applied to the first side 405a of the workpiece 405. In embodiments the first mask layer 410 may include or may be made of a hard masking material, e.g., an oxide, a nitride, or the like.

Figure 4C:
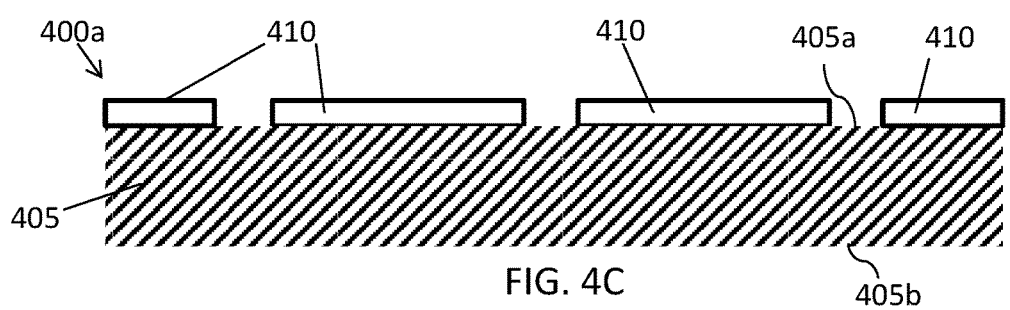

At 315 in FIG. 3, the first mask layer can be patterned to expose the one or more kerf regions of the workpiece. The mask layer may be patterned, e.g., using photolithographic techniques, so that the kerf regions are exposed. For example, a photoresist may be applied to the first mask layer and may be patterned using photolithography and the mask layer may be patterned using the patterned photoresist, e.g., by etching. The photoresist may be stripped (removed) after patterned the mask layer. The embodiment of FIG. 4C depicts a structure 400c in which the mask layer 410 formed on the first side 405a of the semiconductor workpiece 405 has been patterned to expose the one or more kerf regions.

In FIG. 3 at 320, after patterning the first mask layer, the workpiece may be mounted with the patterned mask layer to a carrier. Thus, the second side of the workpiece, which may be opposite to the first side of the workpiece (e.g., a back side), can be exposed. In other words in mounting, the first side of the workpiece can face a mounting surface of the carrier.

Figure 4D:
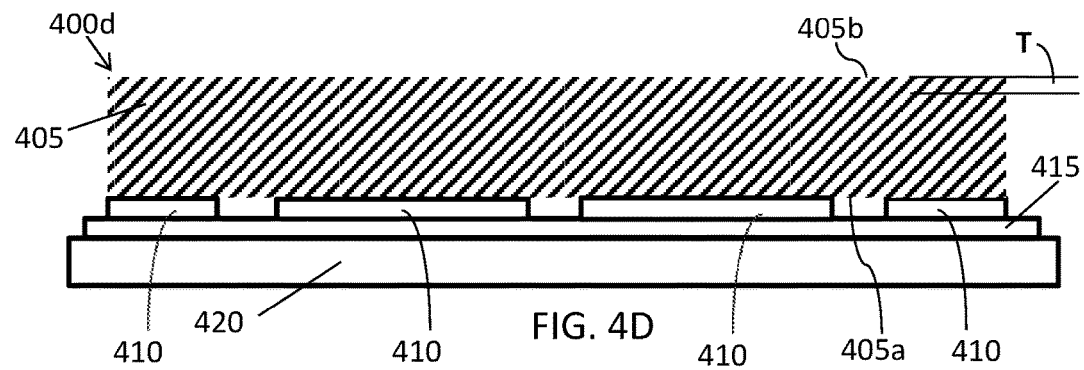

The embodiment of FIG. 4D shows a structure 400d with the workpiece 405 mounted on a carrier 420. The first mask layer 410 is disposed on or in contact with the carrier 420. An adhesive 415 may be used to bond the carrier 420 and the mask layer 410.

In some exemplary embodiments, after mounting, the workpiece may be thinned from the second side after mounting the workpiece but before additional processing to the workpiece. In accordance with exemplary embodiments, the workpiece can be thinned using any suitable method or technique, such as by grinding, in one example. For example referring to FIG. 4D, the workpiece 405 may be thinned a thickness T from the second side 405b. In one or more embodiments, an implantation may be carried out from the second side 405b. In other words, particles, e.g. ions (or dopants) may be implanted into the workpiece 405 (e.g., backside implantation). Alternatively or in addition, there may be one or more other processes that may be carried out.

Figure 4E:
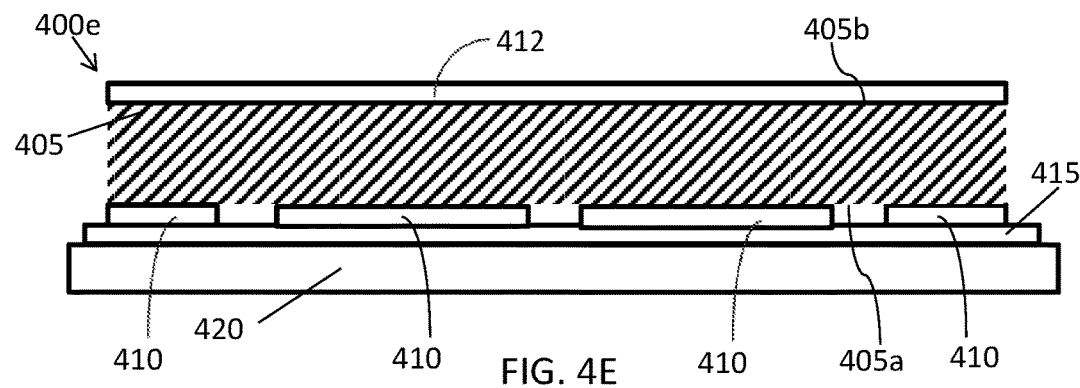

Referring to FIG. 3, after mounting, at 325, a second mask layer may be formed over the second side of the workpiece. The embodiment of FIG. 4E shows a structure 400e showing the workpiece 405 which has been mounted and with a second mask layer 412 formed over the second side 405b of the workpiece 405. The second mask layer 412 may be any suitable mask layer described herein, e.g. including or being made of a hard mask material such as an oxide or the like.

Figure 4F:
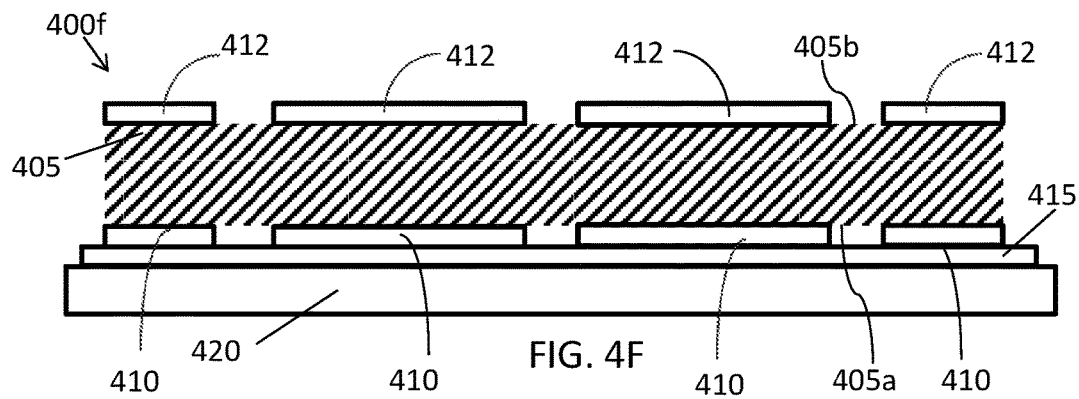

In FIG. 3, at 330 the second mask layer may be patterned to expose the one or more kerf regions. The second mask layer may be patterned using any suitable technique including any technique described herein (e.g., photolithography). The embodiment of FIG. 4F shows a structure 400f in which the second mask layer 412 has been patterned thus exposing the one or more kerf regions of the workpiece 405.

Referring to FIG. 3, at 335, the one or more kerf regions of the workpiece can be etched so as to form trenches. The workpiece can be etched from the second side of the workpiece so as to form trenches that extend from the second side to the first side of the workpiece. In accordance with exemplary embodiments, the trenches can be formed through any suitable etching process, including in one example, plasma etching. Plasma etching may include applying a plasma etchant, e.g., made of any suitable gaseous halogen containing compound e.g., $CF_4$, $SF_6$, $NF_3$, HCl, HBr, $SiF_4$, and the like.

Figure 4G:
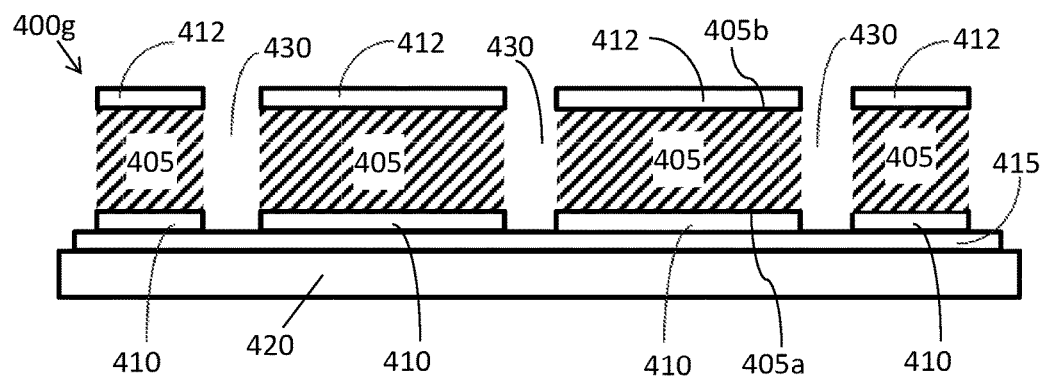
Figure 4H:
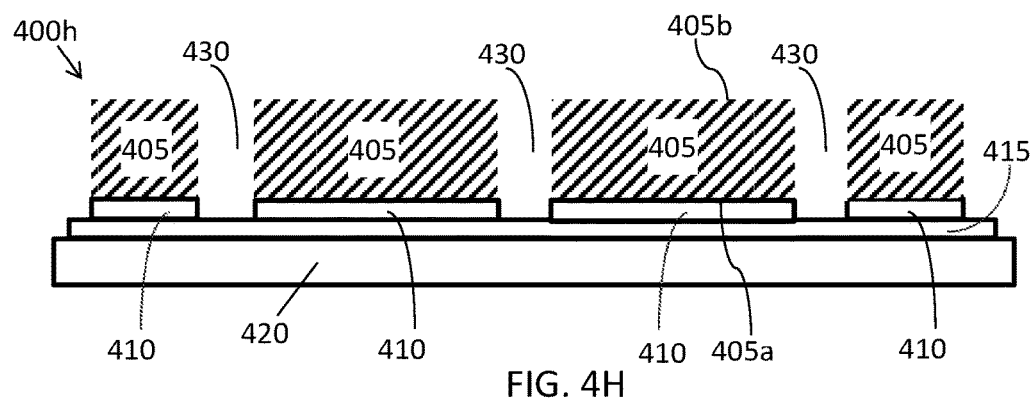
Figure 4I:
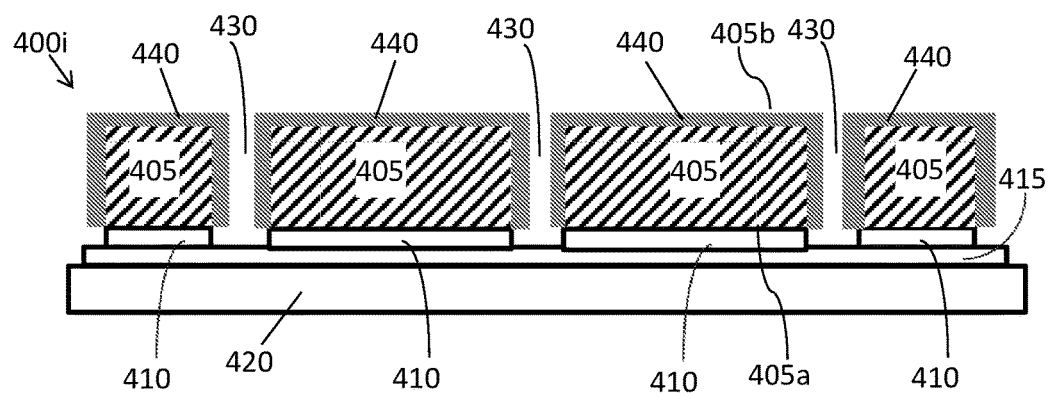

The embodiment of FIG. 4G shows a structure 400g including the workpiece 405 having a plurality of trenches 430 that extend through from the second side 405b to the first side 405a of the workpiece. In one or more embodiments, the workpiece 405 may have been diced by the etching.

After the etching has been completed, the second mask layer may be removed (e.g., using a resist strip process in the case of a photoresist, or any other suitable processes) in one or more embodiments. For example, see FIG. 4H in which the second mask layer 412 has been removed. In one or more embodiments, a polymer layer may possibly have been formed (e.g., in the trenches) as a side product during the plasma etching and may be removed as well.

Referring back to FIG. 3, after etching the workpiece in the one or more kerf regions, a metallization layer may be formed over the second side of the workpiece, at 340. In embodiments, the metallization layer can be formed over the back side of the workpiece and may be formed to at least partially extend in the trenches, such as on the sidewalls. For example, in the embodiment of FIG. 4I, a structure 400i includes a metallization layer 440 formed on the workpiece 405. As shown the metallization layer 440 also extends partially on the trench sidewalls of the workpiece 405. In one or more embodiments, the metallization layer 440 may extend to the second side 405a of the workpiece 405. In one or more embodiments, the metallization layer 440 may extend to the adhesive 415. However, in embodiments, the metallization layer does not necessarily have to be located in the trenches or on the sidewalls, and may be only located on the back side of the structure. In accordance with exemplary embodiments the metallization layer may be formed through any suitable technique, such as by sputter depositing one or more metals onto the workpiece.

After formation of the metallization layer, the resulting structure may be further processed. In exemplary embodiments, the semiconductor workpiece with the metallization layer may be demounted from the carrier. Before demounting, the workpiece with the metallization layer may be laminated onto a tape.

Figure 4J:
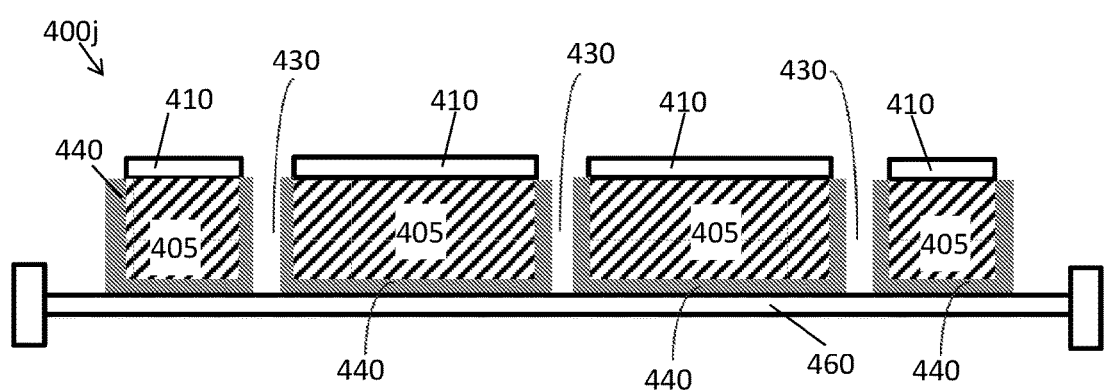

The embodiment of FIG. 4J depicts a structure 400j in which the workpiece 405 has been mounted on a tape 460. As shown the tape 460 attaches to the metallization layer 440. As can be seen in FIG. 4J, a series of individual devices or singulated integrated chips are mounted on the tape 460.

In one or more embodiments, after forming the metallization layer, the workpiece, or the individual devices or chips may be further processed. In one exemplary embodiment the workpiece (e.g., devices or chips) can be mounted to an additional carrier. In this regard, the workpiece (e.g., devices or chips) can be mounted with the metallization layer to the additional carrier. The additional carrier may be, for example, a lead frame, or any other suitable carrier.

In some exemplary embodiments the first mask layer may be removed from the workpiece. For example, the first mask layer may be removed, for example, before and/or after the workpiece has been mounted to an additional carrier. Other implementable processes can include the deposition or addition of other materials, layers, elements, etc. to the workpiece.

Figure 5:
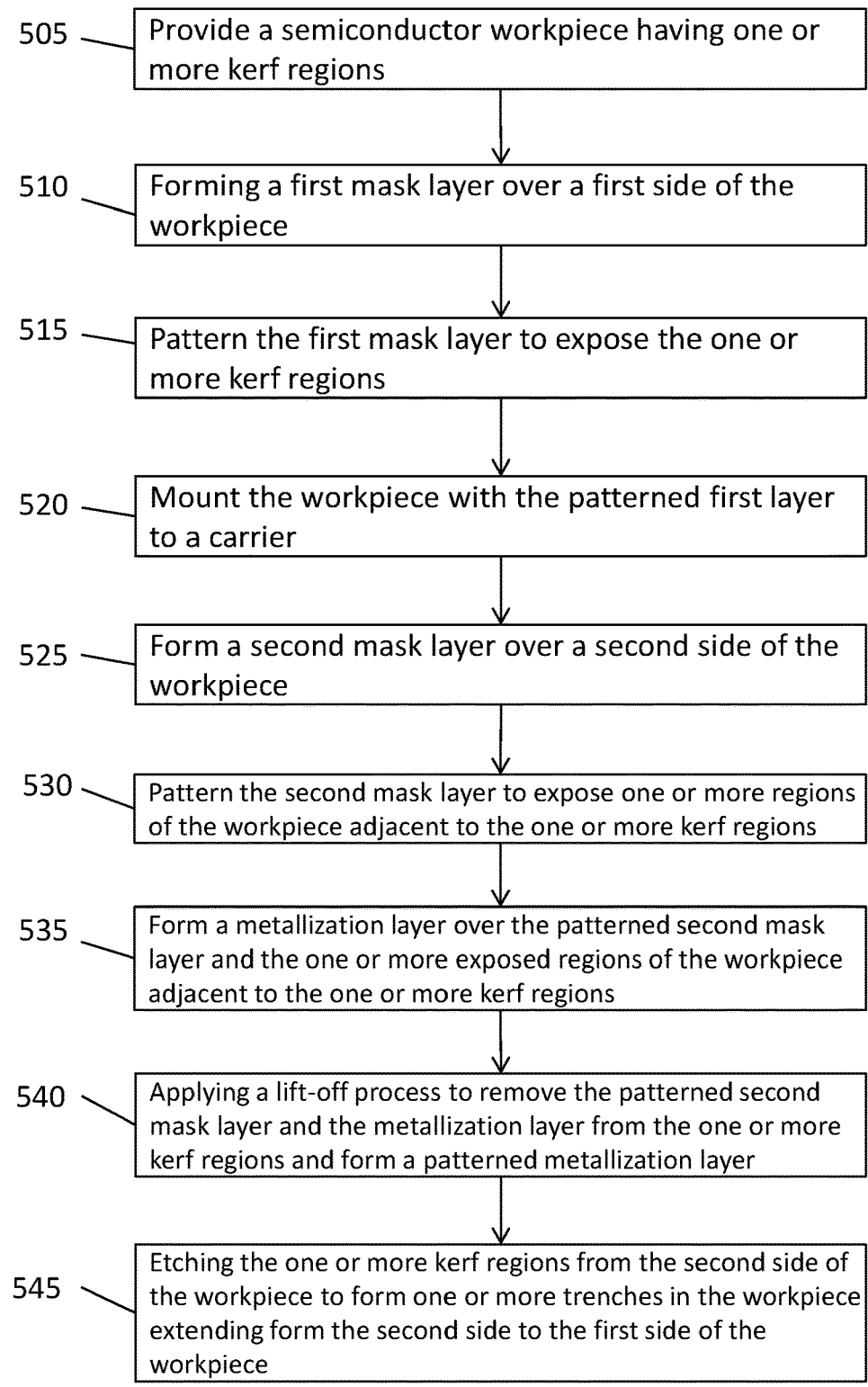
FIG. 5 shows a method for processing a semiconductor workpiece in accordance with various embodiments.

In accordance with exemplary embodiments, FIG. 5 relates to a method for processing a semiconductor structure. In the following, aspects of the method of FIG. 5 can be described with reference to FIGS. 6A to 6J.

Figure 6A:
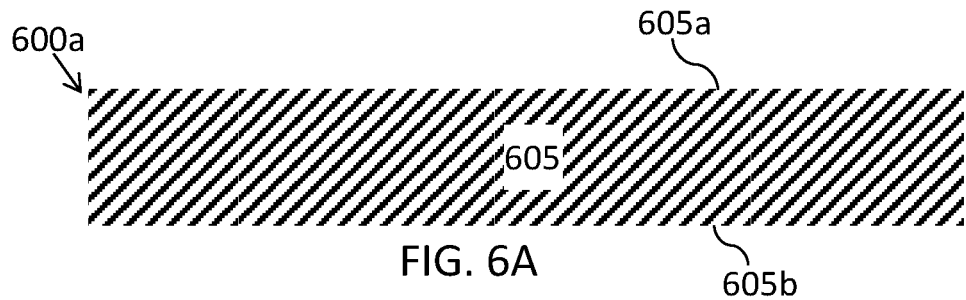
FIGS. 6A-6J illustrate cross-sectional views of semiconductor workpieces in accordance with various embodiments.
Figure 6B:
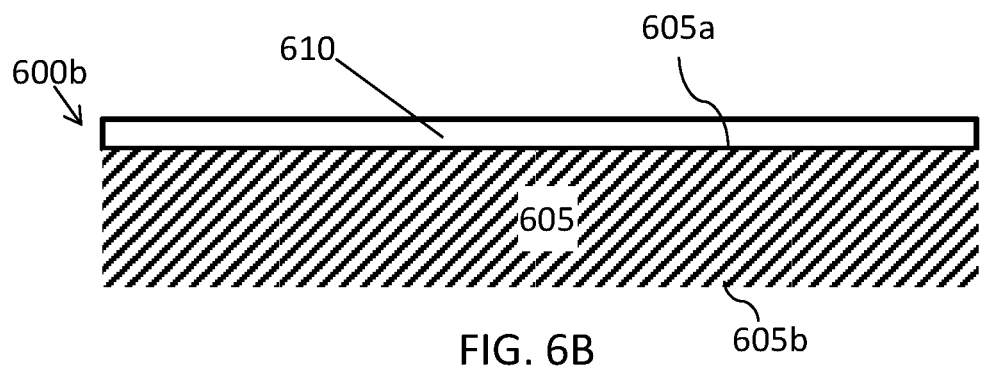

According to exemplary embodiments, at 505 of FIG. 5, a semiconductor workpiece having one or more kerf regions can be provided. The embodiment of FIG. 6A shows a cross-sectional view of a structure 600a, which includes a semiconductor workpiece 405 having a first side 605a and a second side 605b.

The workpiece can be any workpiece previously described herein. In this regard, the workpiece may be a semiconductor wafer that can include at least one semiconductor layer. The semiconductor wafer may include one or more other semiconductor layers, insulators, metal layers, additional elements, etc. that may be directly or indirectly in contact with or attached to the semiconductor layer.

The semiconductor layer can be any semiconductor material previously described herein. Further as previously described, and in accordance with exemplary embodiments, the semiconductor workpiece may include at least one device region or active region. The device or active region may include one or more semiconductor elements, e.g., one or more integrated circuit elements, e.g., one or more active and/or passive elements such as, for example, one or more diodes, transistors, thryistors, capacitors, inductors, or the like. In accordance with one or more embodiments, the device region or active region may include one or more interconnects, e.g., one or more vias and/or one or more electrically conductive lines. The device region may be disposed over a substrate region of the workpiece. In accordance with exemplary embodiments, one or more device regions of the semiconductor workpiece may be located between and/or adjacent to the kerf regions.

In FIG. 5 at 510, a first mask layer may be formed over a first side of the workpiece. In embodiments, the first side may be a front side of the workpiece. For example, a structure 600b in the embodiment of FIG. 6B includes a first mask layer 610 that has been applied to the first side 605a of the workpiece 605. In embodiments the first mask layer 610 may include or may be made of a hard masking material, e.g., an oxide, a nitride, or the like. In one or more embodiments, the mask layer may include or may be made of a photoresist.

Figure 6C:
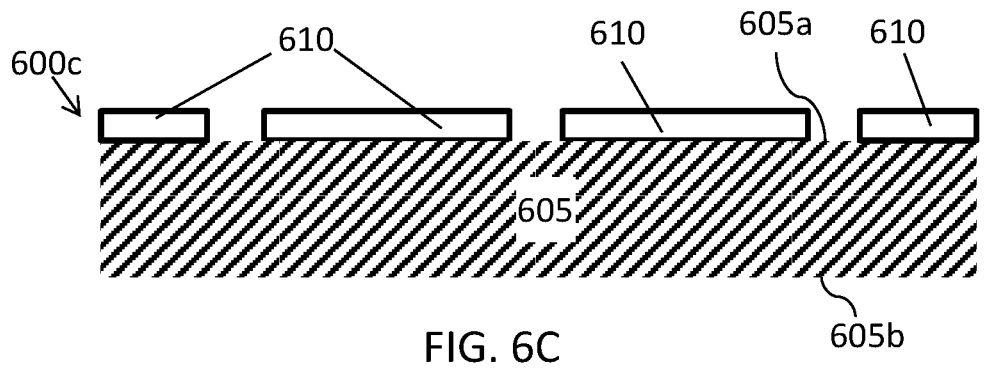

At 515 in FIG. 5, the first mask layer can be patterned to expose the one or more kerf regions of the workpiece. The mask layer may be patterned, e.g., using photolithographic techniques, so that the kerf regions are exposed. The embodiment of FIG. 6C shows a structure 600c in which the mask layer 610 formed on the semiconductor workpiece 605 has been patterned with the one or more kerf regions exposed.

In FIG. 5 at 520, after patterning the first mask layer, the workpiece may be mounted with the patterned mask layer to a carrier. Thus, the second side of the workpiece, which may be opposite to the first side of the workpiece (e.g., a back side), can be exposed. In other words in mounting, the first side of the workpiece can face a mounting surface of the carrier.

Figure 6D:
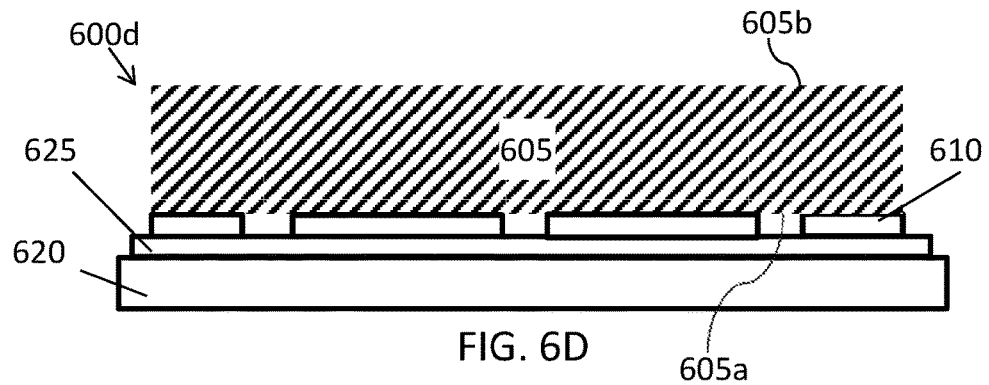

The embodiment of FIG. 6D shows a structure 600d with the workpiece 605 mounted on a carrier 620. The first mask layer 410 is disposed on or in contact with the carrier 620. An adhesive 625 may be used to bond the carrier 620 and the mask layer 610.

In some exemplary embodiments, after mounting, the workpiece may be thinned from the second side after mounting the workpiece but before applying a second mask layer to the workpiece (as described below). In accordance with exemplary embodiments, the workpiece can be thinned using any suitable method or technique, such as by grinding, in one example. For example referring to FIG. 6D, the workpiece 605 may be thinned from the second side 605b. In one or more embodiments, an implantation may be carried out from the second side 605b. In other words, particles, e.g., ions (or dopants) may be implanted into the workpiece 605 (e.g., backside implantation). In embodiments, the implantation may be carried out after the thinning but before applying a second mask layer. Alternatively or in addition, there may be one or more other processes that may be carried out.

Figure 6E:
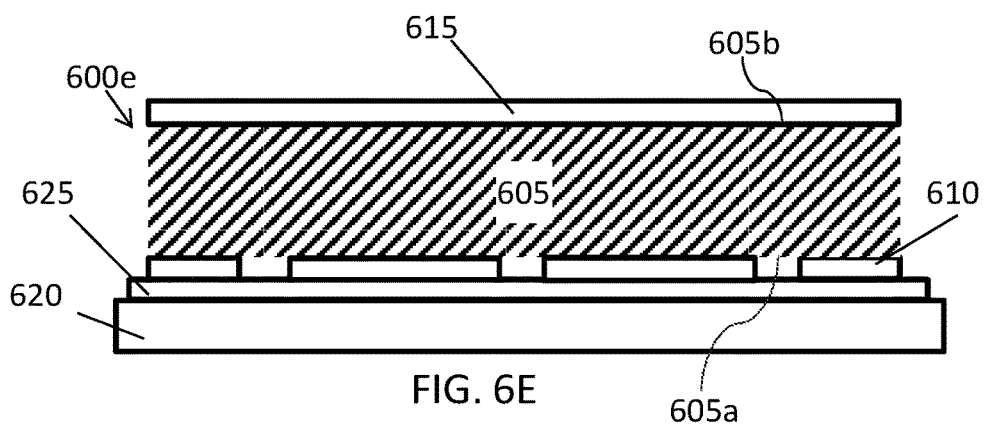

Referring to FIG. 5, after mounting, at 525 a second mask layer may be formed over the second side of the workpiece. The embodiment of FIG. 6E shows a structure 600e showing the workpiece 605 which has been mounted and with a second mask layer 615 formed over the second side 605b of the workpiece 605. The second mask layer may be any suitable mask layer described herein.

Figure 6F:
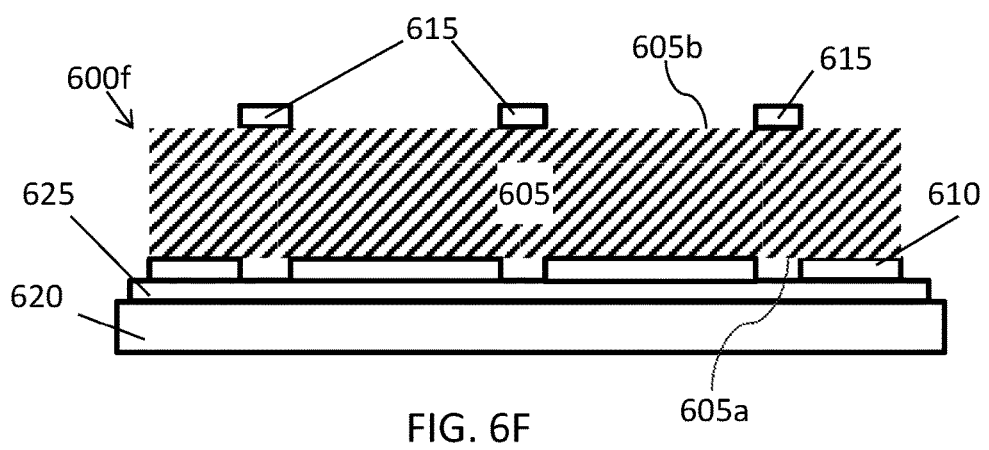

In FIG. 5, at 530 the second mask layer may be patterned so as to expose one or more regions of the workpiece adjacent to the one or more kerf regions. Thus, in some embodiments, the second mask layer may at least partially cover the kerf regions. For example the embodiment of FIG. 6F shows a structure 600f in which the second mask layer 615 has been patterned to expose regions adjacent to the one or more kerf regions of the workpiece 605.

Referring to FIG. 5, after patterning the second mask layer at 535, a metallization layer can be formed over the patterned second mask layer and over the one or more exposed regions of the workpiece adjacent to the one or more kerf regions. In exemplary embodiments, the metallization layer can be formed by any suitable technique, such as by sputter depositing one or more metals onto the workpiece.

Figure 6G:
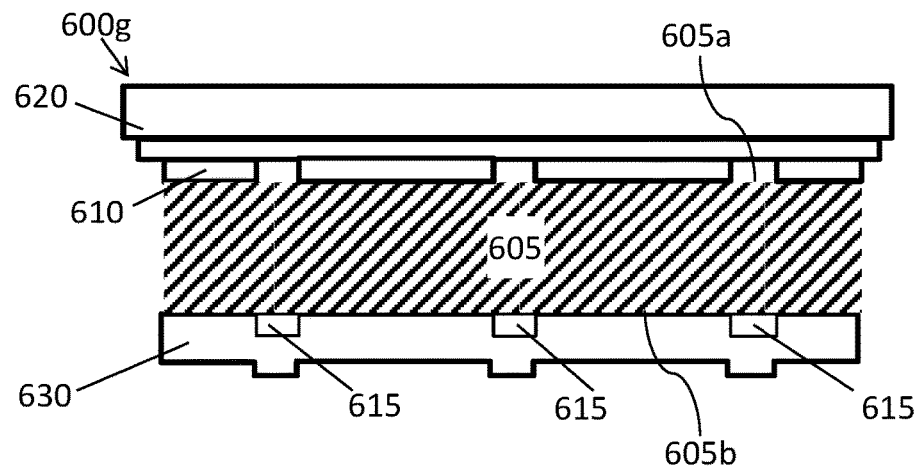

The embodiment of FIG. 6G shows a structure 600g in which a metallization layer 630 has been formed over the patterned second mask layer 615 and over the second side 605b of the workpiece 605.

Referring back to FIG. 5, after forming the metallization layer, at 540 the metallization layer may be patterned by implementing a lift-process to remove the second mask layer and remove some of the metallization layer. Due to the lift-off process materials located on or over the removed sections of the second mask layer, e.g., the sputter deposited metal, can be removed.

Figure 6H:
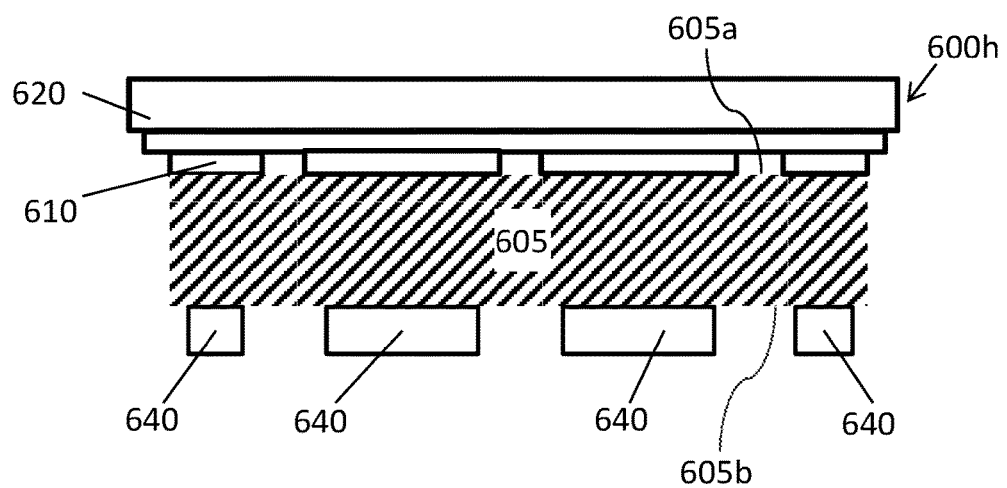
Figure 6I:
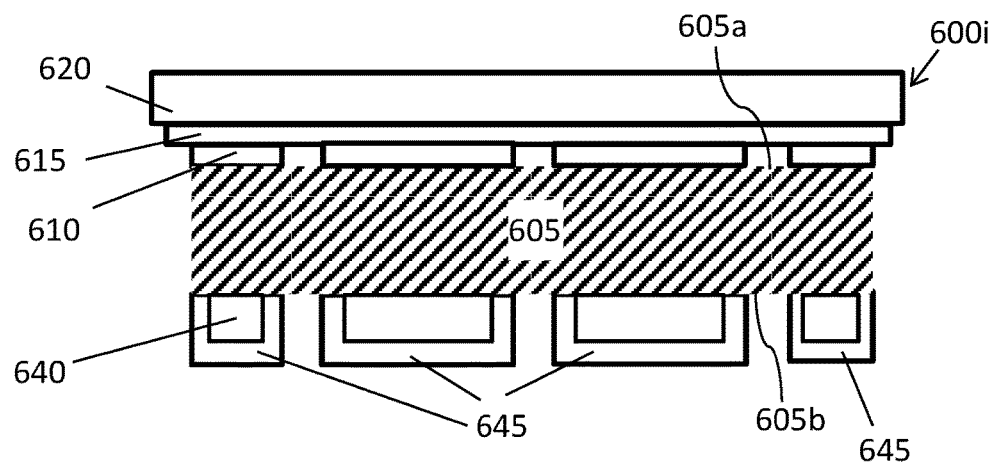

The embodiment of FIG. 6H shows a structure 600h in which a lift off process has been applied to the workpiece 605 to form a patterned metallization layer 640. Portions of the metallization layer 630 adjacent to the kerf regions remain while other portions have been removed to form the patterned metallization layer 640 seen in FIG. 6H. In accordance with exemplary embodiments, the formed patterned metallization layer 640 may not overlap with the kerf regions of the workpiece 605. In other words, the patterned metallization layer 640 may be confined or located so as to be on or over the active or device regions of the workpiece 605.

In FIG. 5, after applying a lift-off process to form the patterned metallization layer over the workpiece, at 545, the one or more kerf regions of the workpiece can be etched from the second side to form one or more trenches in the workpiece extending from the second side to the first side. In accordance with exemplary embodiments, the trenches can be formed through any suitable etching process, including in one example, plasma etching. Plasma etching may include applying a plasma etchant, e.g., made of $CF_4$ and the like.

Figure 6J:
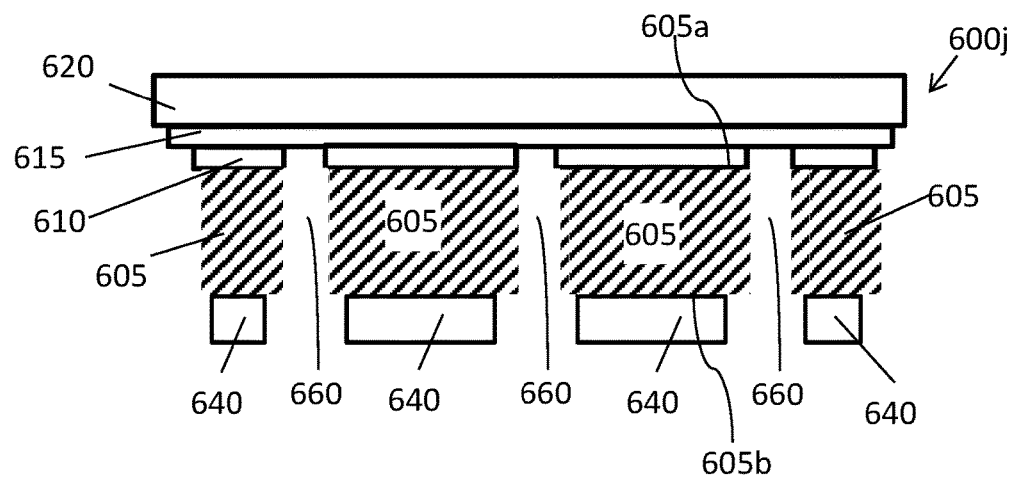

In embodiments, before etching, a protection layer may be applied to the patterned metallization layer. For example, in the embodiment of FIG. 6I, a protection layer 645 formed on the workpiece 605 covers the patterned metallization layer 640. The protection layer 645 applied to cover the patterned metallization layer 640 can be of any suitable material described herein, such as a resist which has photo patterned, or can be a hard mask, etc. The protection layer 645 may be removed after etching. For example, the embodiment of FIG. 6J shows a structure 600j in which one or more trenches 660 extend from the second side 605b to the first side 605a of the workpiece 605.

In accordance with exemplary embodiments, after etching, the resulting workpiece may be subjected to further processing. For example, the first mask layer, coating materials or other material residue (not shown), such as polymers and the like may be removed.

In another example, after etching the workpiece the semiconductor workpiece with the metallization layer may be demounted from the carrier. Before demounting, the workpiece with the metallization layer may be laminated onto a tape.

In one or more embodiments, after forming the metallization layer, the workpiece, or the individual devices or chips may be further processed. In one exemplary embodiment the workpiece (e.g., devices or chips) can be mounted to an additional carrier. In this regard, the workpiece (e.g., devices or chips) can be mounted with the metallization layer to the additional carrier. The additional carrier may be, for example, a lead frame, or any other suitable carrier.

Yet other processes that can be implemented with respect to the workpiece include the deposition or addition of other materials, layers, elements, etc.

Figure 7:
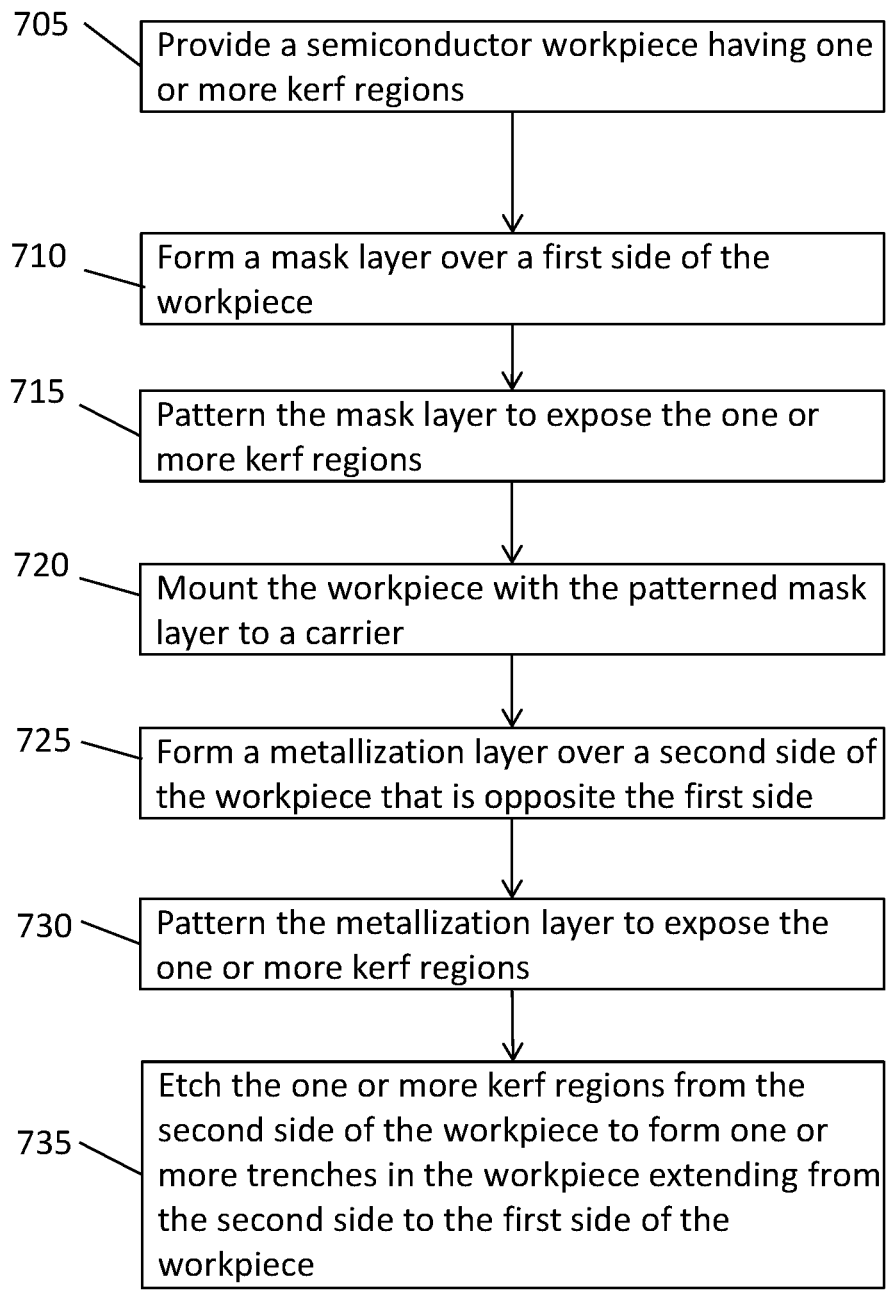
FIG. 7 shows a method for processing a semiconductor workpiece in accordance with various embodiments.

In accordance with exemplary embodiments, FIG. 7 relates to a method for processing semiconductor structures. In the following, aspects of the method of FIG. 7 can be described with reference to FIGS. 8A to 8G.

Figure 8A:
FIGS. 8A-8G illustrate cross-sectional views of semiconductor workpieces in accordance with various embodiments.
Figure 8B:

According to exemplary embodiments, at 705 of FIG. 7, a semiconductor workpiece having one or more kerf regions can be provided. The embodiment of FIG. 8A shows a cross-sectional view of a structure 800a, which includes a semiconductor workpiece 805 having a first side 805a and a second side 805b.

The workpiece can be any workpiece previously described herein. In this regard, the workpiece may be a semiconductor wafer that can include at least one semiconductor layer. The semiconductor wafer may include one or more other semiconductor layers, insulators, metal layers, additional elements, etc. that may be directly or indirectly in contact with or attached to the semiconductor layer. The semiconductor layer can be any semiconductor material previously described herein. Further as previously described, and in accordance with exemplary embodiments, the semiconductor workpiece may include at least one device region or active region. The device or active region may include one or more semiconductor elements, e.g., one or more integrated circuit elements, e.g., one or more active and/or passive elements such as, for example, one or more diodes, transistors, thryistors, capacitors, inductors, or the like. In accordance with one or more embodiments, the device region or active region may include one or more interconnects, e.g., one or more vias and/or one or more electrically conductive lines. The device region may be disposed over a substrate region of the workpiece. In accordance with exemplary embodiments, one or more device regions of the semiconductor workpiece may be located between and/or adjacent to the kerf regions.

In FIG. 7 at 710, a mask layer can be formed over a first side of the workpiece. In embodiments, the first side may be a front side of the workpiece. For example, a structure 800b in the embodiment of FIG. 8B includes a mask layer 810 that has been applied to the first side 805a of the workpiece 805. In embodiments the mask layer 810 may include or may be made of a hard masking material, e.g., an oxide, a nitride, or the like. In one or more embodiments, the mask layer may include or may be made of a photoresist.

Figure 8C:
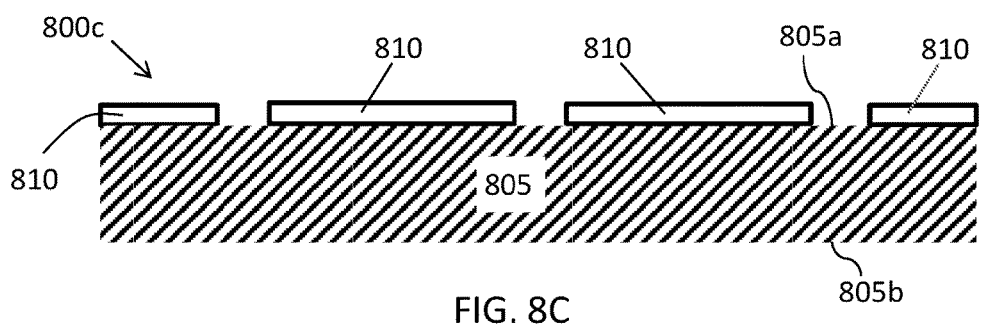

At 715 in FIG. 7, the mask layer may be patterned to expose the one or more kerf regions of the workpiece. The mask layer may be patterned, e.g., using photolithographic techniques, so that the kerf regions are exposed. The embodiment of FIG. 8C depicts a structure 800c in which the mask layer 810 formed on the first side 805a of the semiconductor workpiece 805 has been patterned to expose the one or more kerf regions.

Then in FIG. 7 at 720, after patterning the mask layer, the workpiece may be mounted with the patterned mask layer to a carrier. Thus, the second side of the workpiece, which may be opposite to the first side of the workpiece (e.g., a back side), can be exposed. In other words in mounting, the first side of the workpiece can face a mounting surface of the carrier.

Figure 8D:
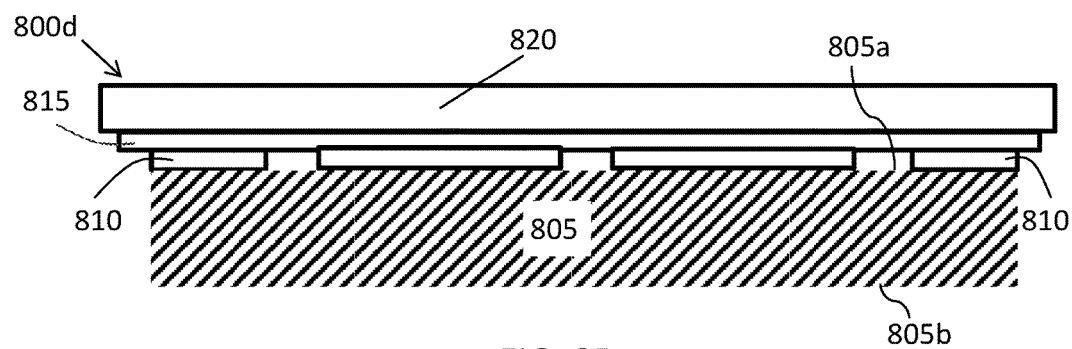

The embodiment of FIG. 8D shows a structure 800d with the workpiece 805 mounted on a carrier 820. The mask layer 810 is disposed on or in contact with the carrier 820. An adhesive 815 may be used to bond the carrier 820 and the mask layer 810.

In some exemplary embodiments, after mounting, the workpiece may be thinned from the second side after mounting the workpiece but before applying a metallization layer to the workpiece (as will be described below). In accordance with exemplary embodiments, the workpiece can be thinned using any suitable method or technique, such as by grinding, in one example. For example referring to FIG. 8D, the workpiece 805 may be thinned from the second side 805b. In one or more embodiments, an implantation may be carried out from the second side 805b. In other words, particles, e.g., ions (or dopants) may be implanted into the workpiece 805 (e.g., backside implantation). In embodiments, the implantation may be carried out after the thinning but before applying a metallization layer. Alternatively or in addition, there may be other processes that may be carried out.

Figure 8E:
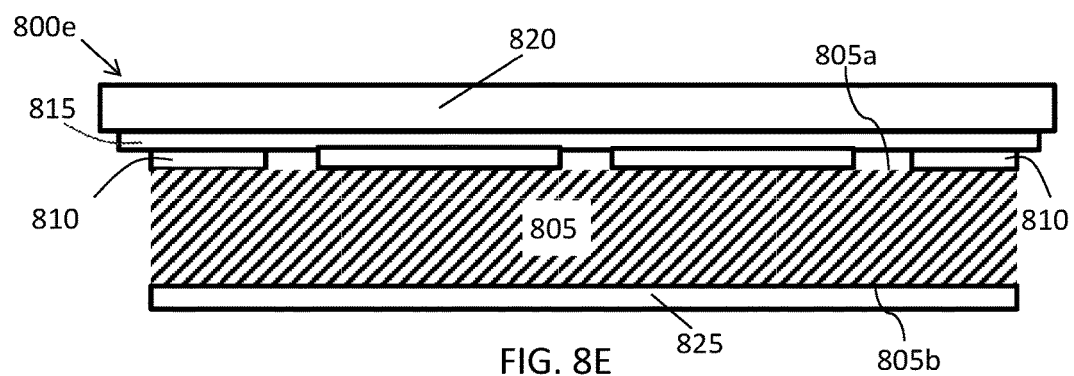

Referring to FIG. 7, after mounting, at 725, a metallization layer can be formed over the second side of the workpiece. For example the embodiment of FIG. 8E shows a structure 800e that includes a semiconductor workpiece 805 with a metallization layer 825 formed on the second side 805b of the workpiece 805. In accordance with exemplary embodiments, the metallization layer 825 can be formed using any suitable method, including, for example, by sputter depositing metal on the workpiece 805.

Figure 8F:
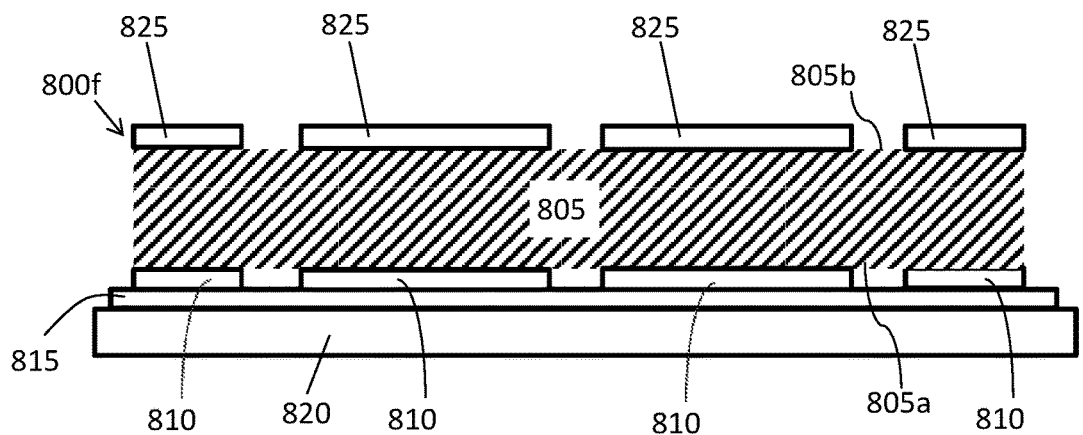

Referring back to FIG. 7, at 730 the metallization layer formed on the second side of the workpiece can be patterned to expose the one or more kerf regions. The metallization layer can be patterned using any suitable process, including any processes described herein. In one exemplary embodiment, the backside metallization layer can be patterned through a metal etching process. For example, examples of such metal etching processes are described in detail in U.S. patent application Ser. No. 13/903,013, the contents of which are incorporated by reference in their entirety. In accordance with exemplary embodiments, FIG. 8F, shows a structure 800f including a patterned metallization layer 825 formed on the second side 805b of the workpiece 805. As shown the kerf regions of the workpiece 805 are exposed.

In accordance with exemplary embodiments, prior to patterning the metallization layer, a second mask layer may be formed over the metallization layer. The second mask layer may be any suitable mask layer described herein and may be patterned to expose one or more regions of the metallization layer disposed over the one or more kerf regions. Any suitable technique including any technique described herein (e.g., photolithography) may be used to pattern the second mask layer. Then, after patterning the second mask layer, the one or more exposed regions of the metallization layer can be etched.

In accordance with exemplary embodiments, the one or more exposed regions of the metallization layer may be etched using a wet chemical etch process and/or a dry etch process. Any second mask layer may be removed after patterning the metallization layer (e.g., using a resist strip process in the case of a photoresist, or any other suitable processes) in one or more embodiments.

In FIG. 7, after patterning the metallization layer, at 735, the one or more kerf regions of the workpiece can be etched so as to form trenches. The workpiece can be etched from the second side of the workpiece so as to form trenches that extend from the second side to the first side of the workpiece. In accordance with exemplary embodiments, the trenches can be formed through any suitable etching process, including in one example, plasma etching. Plasma etching may include applying a plasma etchant, e.g., made of any suitable gaseous halogen containing compound e.g., $CF_4$, $SF_6$, $NF_3$, HCl, HBr, $SiF_4$, and the like. In accordance with exemplary embodiments, the second masking layer or another masking layer may be used to cover or protect the non-kerf regions of the workpiece during etching of the one or more kerf regions. After etching the workpiece this masking layer may be removed, using any suitable technique.

Figure 8G:
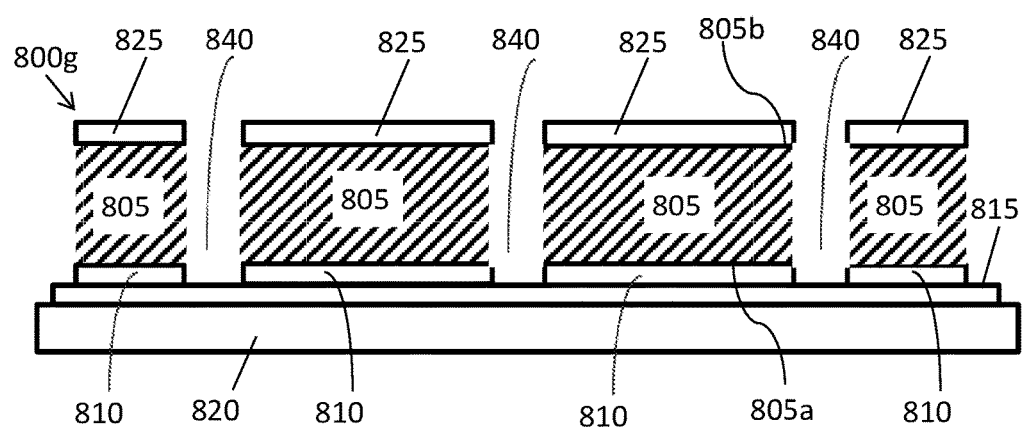

The embodiment of FIG. 8G shows a structure 800g including the workpiece 805 having a plurality of trenches 830 that extend through from the second side 805b to the first side 805a of the workpiece. In one or more embodiments, the workpiece 805 may have been diced by the etching.

In accordance with one or more embodiments, after etching the workpiece, the resulting structure may be further processed. In exemplary embodiments, the semiconductor workpiece may be demounted from the carrier. Before demounting, the workpiece with the metallization layer may be laminated onto a tape.

In one exemplary embodiment the workpiece (e.g., devices or chips) can be mounted to an additional carrier. In this regard, the workpiece (e.g., devices or chips) can be mounted with the metallization layer to the additional carrier. The additional carrier may be, for example, a lead frame, or any other suitable carrier.

In some exemplary embodiments the first mask layer may be removed from the workpiece. For example, the first mask layer may be removed, for example, before and/or after the workpiece has been mounted to an additional carrier. Other implementable processes can include the deposition or addition of other materials, layers, elements, etc. to the workpiece.

Figure 9:
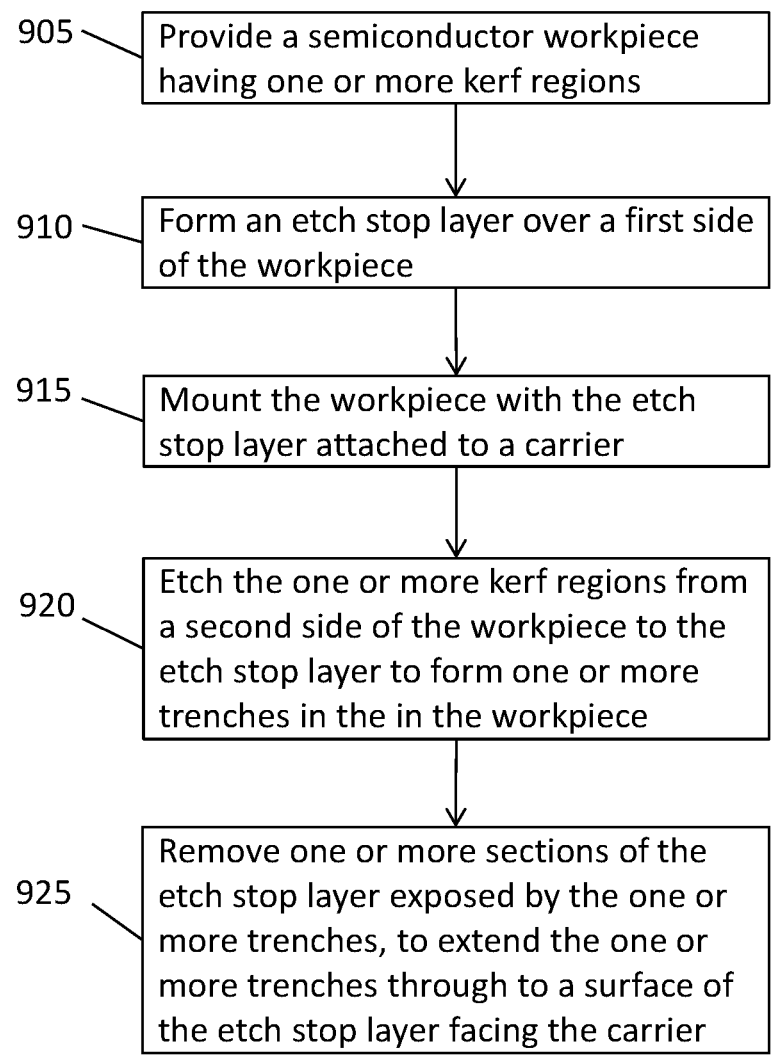
FIG. 9 shows a method for processing a semiconductor workpiece in accordance with various embodiments.

In accordance with exemplary embodiments, FIG. 9 relates to a method for processing semiconductor workpieces. In the following, aspects of the method of FIG. 9 can be described with reference to FIG. 10A to 10G.

Figure 10A:
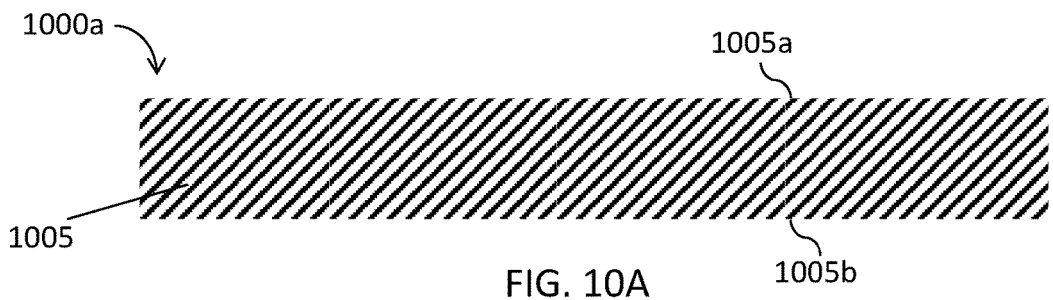
FIGS. 10A-10H illustrate cross-sectional views of semiconductor workpieces in accordance with various embodiments.
Figure 10B:
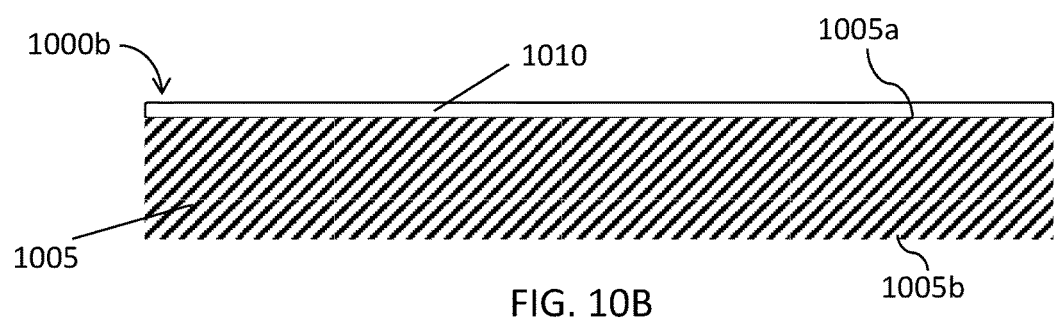

According to exemplary embodiments, at 905 of FIG. 9, a semiconductor workpiece having one or more kerf regions can be provided. The embodiment of FIG. 10A shows a cross-sectional view of a structure 1000a, which includes a semiconductor workpiece 1005 having a first side 1005a and a second side 1005b.

The workpiece can be any workpiece previously described herein. In this regard, the workpiece may be a semiconductor wafer that can include at least one semiconductor layer. The semiconductor wafer may include one or more other semiconductor layers, insulators, metal layers, additional elements, etc. that may be directly or indirectly in contact with or attached to the semiconductor layer. The semiconductor layer can be any semiconductor material previously described herein. Further as previously described, and in accordance exemplary embodiments, the semiconductor workpiece may include at least one device region or active region. The device or active region may include one or more semiconductor elements, e.g., one or more integrated circuit elements, e.g., one or more active and/or passive elements such as, for example, one or more diodes, transistors, thryistors, capacitors, inductors, or the like. In accordance with one or more embodiments, the device region or active region may include one or more interconnects, e.g., one or more vias and/or one or more electrically conductive lines. The device region may be disposed over a substrate region of the workpiece. In accordance with exemplary embodiments, one or more device regions of the semiconductor workpiece may be located between and/or adjacent to the kerf regions.

In FIG. 9, at 910, an etch stop layer may be formed over a first side of the workpiece. For example, the embodiment of FIG. 10A depicts a structure 1000a depicting an etch stop layer 1010 formed over a front side of a semiconductor workpiece 1005. As previously mentioned in relation to various embodiments described herein, the semiconductor workpiece 1005 may include at least one semiconductor layer or wafer, and may include other elements or layers (e.g., metal layers, insulator, devices, etc.). For example, one or more semiconductor chips may be formed in or on the workpiece 1005. The one or more kerf regions may be located between active or device regions of the workpiece 1005.

In accordance with exemplary embodiments, the etch stop layer may be made out of any suitable material. In embodiments, the first side may be a front side of the workpiece. For example, a structure 1000b in the embodiment of FIG. 10B includes an etch stop layer 1010 that has been applied to the first side 1005a of the workpiece 1005. In embodiments the etch stop layer 1010 may include or may be made of one or more dielectric materials. In another example the etch stop layer may include or may be a hard masking material, e.g., an oxide, a nitride, or any carbon and/or nitrogen hydrogen compound, (e.g., a resist, a synthetic foil, or a polymer foil), a metal (e.g., copper), or the like.

In one or more embodiments, the etch stop layer 1010 (e.g., an oxide layer) may have been formed over the first side 1005a and the second side 1005b initially, and may have been removed from the second side 1005b (e.g., backside) subsequently.

In one or more embodiments, the etch stop layer may have a thickness in the range of about one or more atomic monolayers to about 1 mm, or more than 1 mm, e.g., about 2 mm, although other thicknesses may be possible.

Referring to FIG. 9, at 915 the workpiece can be mounted with the etch stop layer attached to a carrier. Thus, the second side of the workpiece, which may be opposite to the first side of the workpiece (e.g., a back side), can be exposed. In other words in mounting, the first side of the workpiece can face a mounting surface of the carrier. In accordance with exemplary embodiments, a foil or any other suitable protective layer, e.g., a film, may be applied or attached to the first side of the workpiece before the workpiece is attached to the carrier.

Figure 10C:
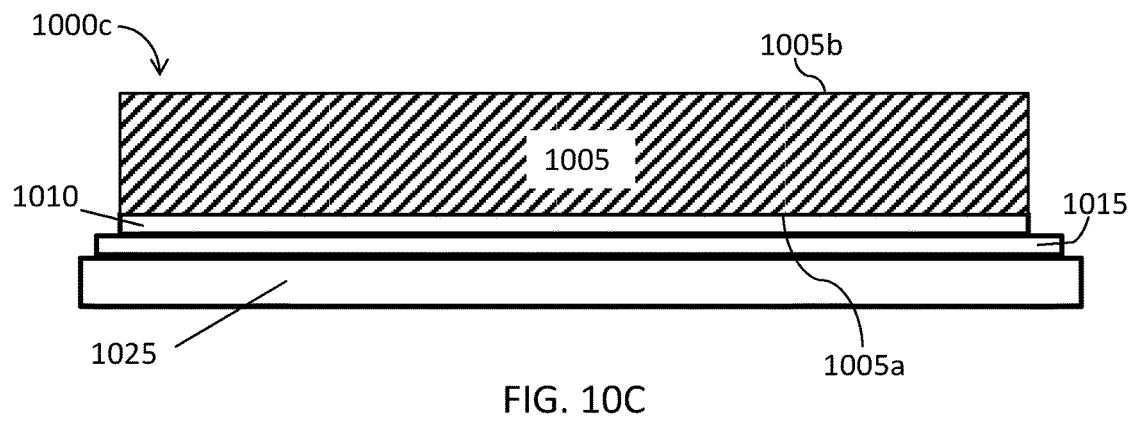

The embodiment of FIG. 10C shows a structure 1000c with the workpiece 1005 mounted on a carrier 1025. The etch stop layer 1010 is disposed on or in contact with the carrier 1025. An adhesive (with or without a foil) 1015 may be used to bond the carrier 1025 and the etch stop layer 1010.

In some exemplary embodiments, after mounting, the workpiece may be thinned from the second side after mounting the workpiece but before applying a metallization layer to the workpiece (as will be described further below). In accordance with exemplary embodiments, the workpiece can be thinned using any suitable method or technique, such as by grinding, in one example. For example referring to FIG. 10C, the workpiece 1005 may be thinned from the second side 1005b. In one or more embodiments, an implantation may be carried out from the second side 1005b. In other words, particles, e.g., ions (or dopants) may be implanted into the workpiece 1005 (e.g., backside implantation). The implantation may be carried out after the thinning but before applying the metallization layer.

In. FIG. 9, at 920 the one or more kerf regions of the workpiece can be etched from the second side to the etch stop layer so as to form one or more trenches in the workpiece. In accordance with exemplary embodiments, the trenches can be formed through any suitable etching process, including in one example, plasma etching. Plasma etching may include applying a plasma etchant, e.g., made of $CF_4$ and the like. The etching process, e.g., plasma etching or the like, can stop or be finished at the etch stop layer, which serves as a termination point for the etching process.

In embodiments, before etching, a patterned mask layer may be formed over the second side of the workpiece. The patterned mask layer may be formed in accordance with various embodiments described herein to expose the one or more kerf regions of the workpiece. For example, a mask layer (including or made from any suitable material(s) described herein) may be applied to the workpiece and subsequently patterned.

Figure 10D:
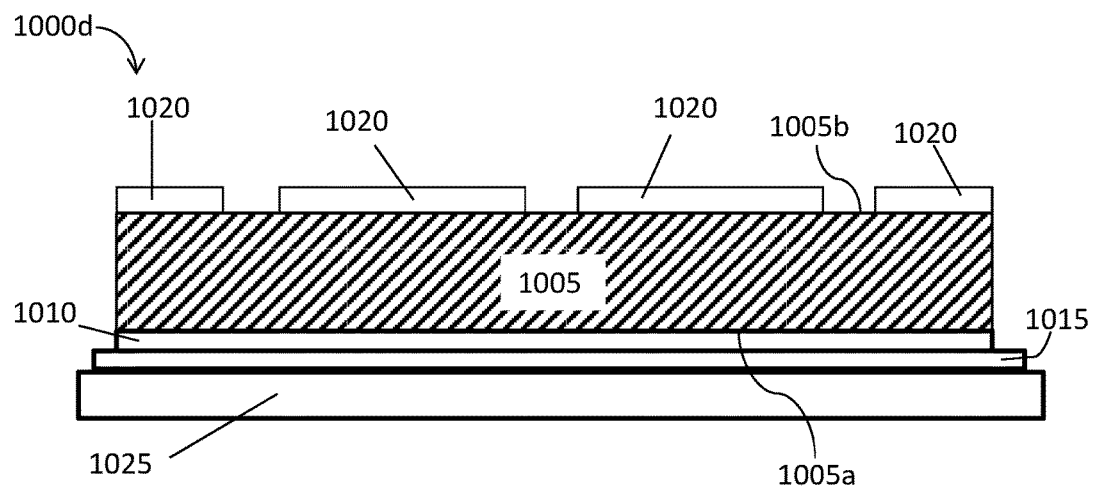

The embodiment of FIG. 10D shows a structure 1000d including the workpiece 1005 having a patterned mask layer 1020 formed on the second side 1005b of the workpiece. As shown, the one or more kerf regions of the workpiece 1005 are exposed or not covered by the patterned mask layer 1020.

Figure 10E:
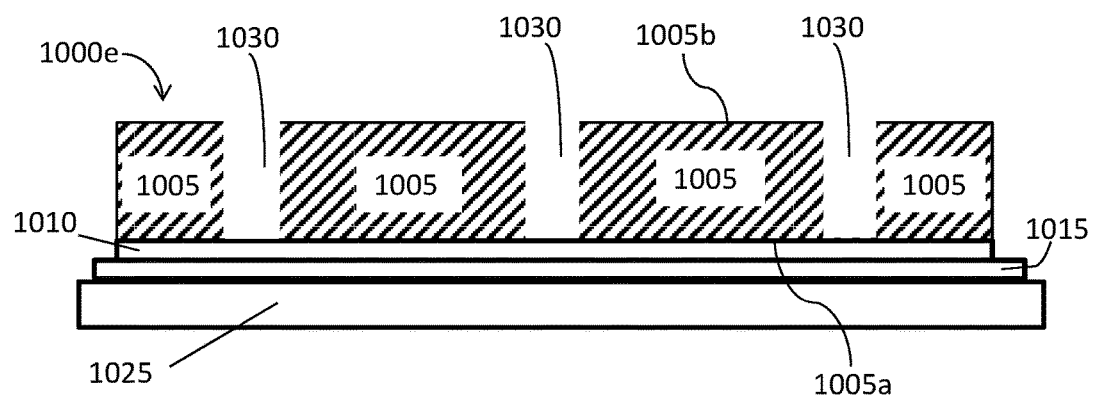

The embodiment of FIG. 10E shows a structure 1000e including the workpiece 1005 having a plurality of trenches 1030 that extend through from the second side 1005b to the etch stop layer 1010. As shown, the mask layer 1020 has been removed from the workpiece 1005.

Referring back to FIG. 9, after formation of the one or more trenches, at 925 one or more sections of the etch stop layer exposed by the one or more trenches may be removed so as to extend the one or more trenches through to the surface of the etch stop layer which is facing the carrier. The etch stop layer can be removed using any suitable or appropriate techniques. The sections or portions of the etch stop layer may be removed by various etching processes including any etching processes described herein.

Figure 10F:
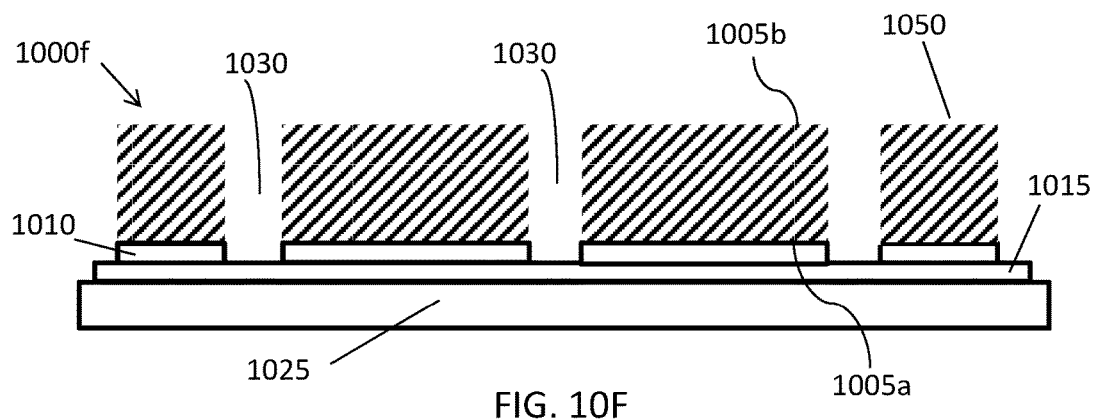

Referring to the embodiment of FIG. 10F, a structure 1000f includes a workpiece 1005 in which the trenches 1030 have been extended by virtue of removing sections of the etch stop layer 1010 previously exposed by the trenches 1030. The mask layer 1020 has been removed from the semiconductor workpiece 1005.

Figure 10G:
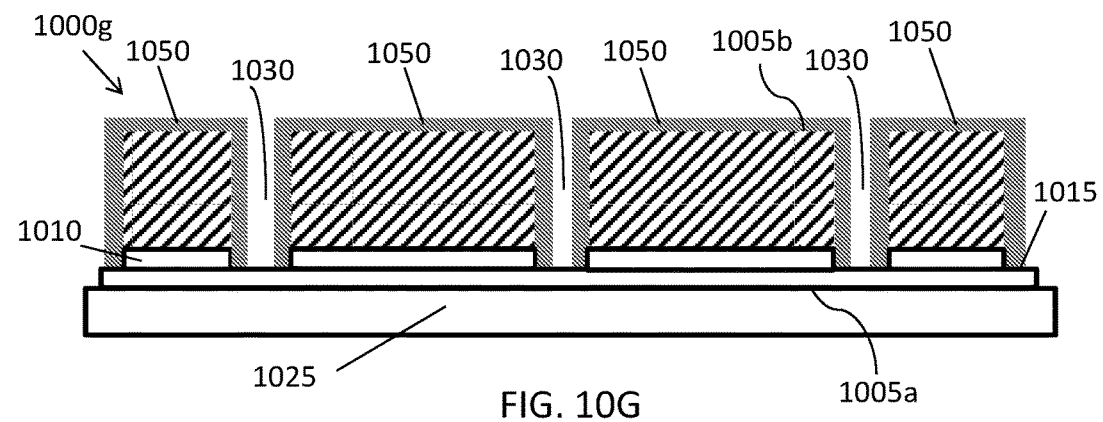

In accordance with exemplary embodiments, after extending the trenches of the workpiece, the workpiece may be further processed. For example, a metallization layer may be formed over the second side of the workpiece. Such a metallization layer may extend, at least partially, into the trenches. For example, the embodiment of FIG. 10G shows a structure 1000g that includes a metallization layer 1050 formed on the second side 1005b of the workpiece 1005 and on the sidewalls. In some embodiments, the metallization layer 1050 may extend all the way up the trench sidewalls (e.g., to the adhesive 1015), or in other cases, not be formed at all in the trenches or on the trench sidewalls.

Figure 10H:
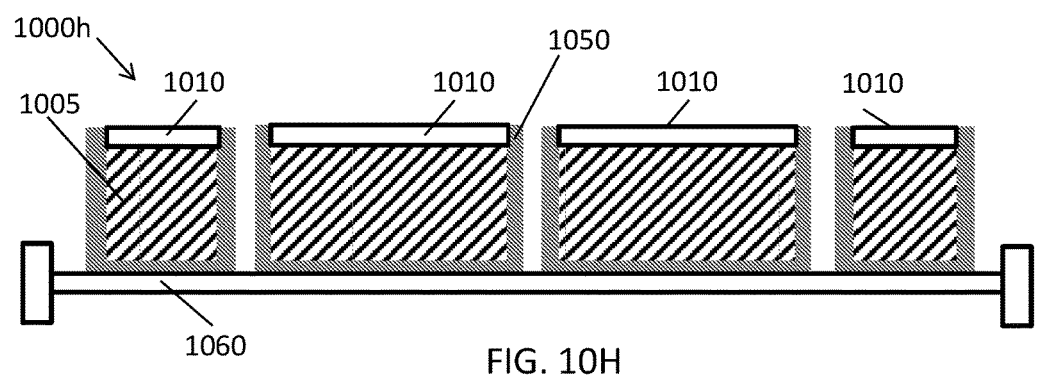

After forming the metallization layer, the workpiece may still be further processed. In exemplary embodiments, the semiconductor workpiece may be demounted from the carrier. Before demounting, the workpiece with the metallization layer may be laminated onto a tape. For example, the embodiment of FIG. 10H depicts a structure 1000h in which the workpiece 1005 has been mounted on a tape 1060. As shown the tape 1060 attaches to the metallization layer 1050. As can be seen in FIG. 10H, the workpiece 1005 can be considered as a series of individual devices or singulated integrated chips that are mounted on the tape 1060.

In one exemplary embodiment the workpiece (e.g., devices or chips) can be mounted to an additional carrier. In this regard, the workpiece (e.g., devices or chips) can be mounted with the metallization layer to the additional carrier. The additional carrier may be, for example, a lead frame, or any other suitable carrier. Other implementable processes can include the deposition or addition of other materials, layers, elements, etc. to the workpiece. In accordance with exemplary embodiments, further processing may include removing the etch stop layer and/or removing other layers, materials, residue, etc.

Figure 11:
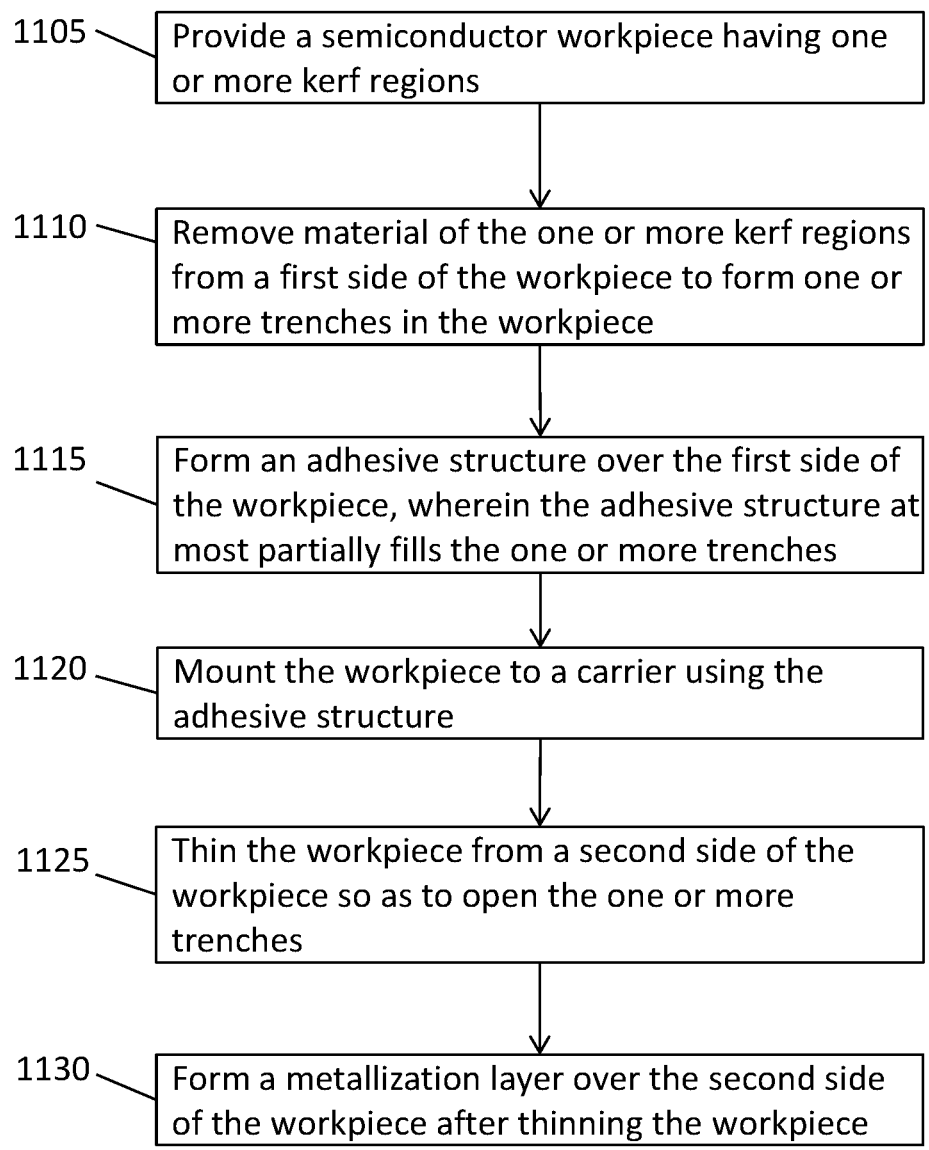
FIG. 11 shows a method for processing a semiconductor workpiece in accordance with various embodiments.
Figure 12A:
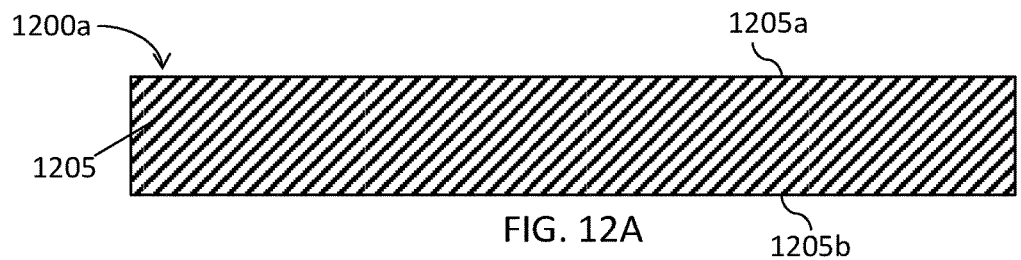
FIGS. 12A-12F illustrate cross-sectional views of semiconductor workpieces in accordance with various embodiments.

FIG. 11 shows according to an exemplary embodiment, a method for processing a semiconductor workpiece. According to the method, at 1105, a semiconductor workpiece is provided having one or more kerf regions. The embodiment of FIG. 12A shows a cross-sectional view of a structure 1200a, which includes a semiconductor workpiece 1205 with a first side 1205a and a second side 1205b.

The workpiece can be any workpiece previously described herein. In this regard, the workpiece may be a semiconductor wafer that can include at least one semiconductor layer. The semiconductor wafer may include one or more other semiconductor layers, insulators, metal layers, additional elements, etc. that may be directly or indirectly in contact with or attached to the semiconductor layer. The semiconductor layer can be any semiconductor material previously described herein. Further as previously described, and in accordance with exemplary embodiments, the semiconductor workpiece may include at least one device region or active region. The device or active region may include one or more semiconductor elements, e.g., one or more integrated circuit elements, e.g., one or more active and/or passive elements such as, for example, one or more diodes, transistors, thryistors, capacitors, inductors, or the like. In accordance with one or more embodiments, the device region or active region may include one or more interconnects, e.g., one or more vias and/or one or more electrically conductive lines. The device region may be disposed over a substrate region of the workpiece. In accordance with exemplary embodiments, one or more device regions of the semiconductor workpiece may be located between and/or adjacent to the kerf regions.

Referring back to FIG. 11, at 1110, material may be removed from the kerf regions of the semiconductor workpiece to form one or more trenches. The trenches may extend at least partially through the workpiece. In embodiments, the trenches can be formed by dicing at a first side (e.g., front side) of the workpiece towards a second side (e.g., back side) of the workpiece. In accordance with exemplary embodiments, the trenches can be formed through sawing, etching, etc. For example in the case of etching, a plasma etchant such as $CF_4$ or the like may be used.

In embodiments, prior to removing material from the first side of the workpiece, a patterned mask layer may be formed on the first side of the workpiece leaving the kerf regions exposed. In some embodiments, the mask layer may be a hard mask or any other suitable mask material. The mask layer may be removed subsequent to the removal of material from the kerf regions of the workpiece.

Figure 12B:
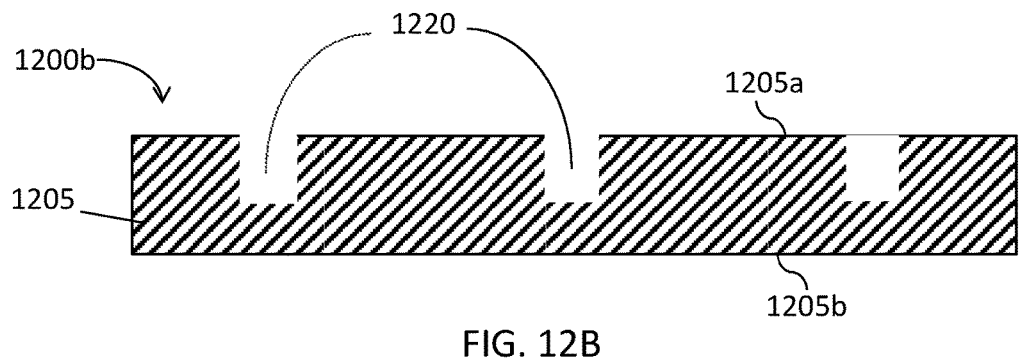

The embodiment of FIG. 12B shows a structure 1200b in which the material of the kerf regions of the semiconductor workpiece 1205 has been removed to form a plurality of trenches 1220. As seen in FIG. 12B, the trenches 1220 are formed from the first side 1205a of the workpiece 1205, and extend toward, but not fully toward the second side 1205b of the workpiece 1205.

Referring back to FIG. 11, at 1115, an adhesive structure may be formed over the first side of the workpiece, wherein the adhesive structure at most partially fills the one or more trenches. In accordance with exemplary embodiments, the adhesive structure may include an adhesive and may further include another structural element, such as a foil. The other structural element, e.g. foil, may be configured or serve as a protective layer to prevent the adhesive from entering the one or more trenches. The adhesive structure may be applied at once to the carrier, for example a foil with an adhesive thereon applied to a carrier.

In some embodiments an exemplary adhesive structure may be formed over the workpiece by applying the foil to a first side of the workpiece and then subsequently depositing the adhesive on or over the foil. In one or more embodiments, the adhesive may be applied by a dispenser. In one or more embodiments, the adhesive may be a liquid adhesive. In one or more embodiments, the adhesive may be applied through a spin coating process. That is, the foil can be applied or attached to a side or surface of the workpiece that is to be subsequently attached, e.g., bonded to another element, layer, material, etc. The foil can allow the workpiece to attach and bond to another element but can prevent adhesive (e.g., glue or the like) from substantially entering and/or seeping into the trenches and/or on the sidewalls of the workpiece. That is, only a small or negligible amount of adhesive may enter the trenches.

In cases where the adhesive structure includes a foil, the foil may be temperature resistant. For example, the foil may be able to withstand temperatures up to about 100° C., e.g. up to about 200° C., e.g. up to about 300° C., or even higher temperatures, e.g. temperatures in the range from about −100° C. up to about 400° C.

In one or more embodiments, the foil may include or may be made of temperature stable organic polymers, such as polyesters, polyimides, polyethers, polysilicones, and/or derivatives thereof. The adhesive of such a foil may include or may be made of temperature stable organic polymers or materials such as silicones, acrylics, and/or derivatives thereof.

In one or more embodiments, the foil may have a thickness in the range of about 1 μm to about 200 μm, although other thicknesses may be possible as well.

In some embodiments, the adhesive structure may include only an adhesive, wherein the adhesive may be configured such that it does not or only to a very small degree enter the trenches. Examples of such adhesives may include, but are not limited to, e.g. temperature stable organic polymers and/or materials such as, for example, silicones, acrylics, and/or derivatives thereof.

In accordance with one or more embodiments, protective layers described herein are not necessarily limited to foil systems. Protective layers may include or be made out of organic polymers/materials, (e.g., polyvinyl alcohols, imides, acrylics, teflons, and derivatives thereof), inorganic materials (e.g., oxides, nitrides, etc.), and/or combinations of various organic and/or inorganic materials, which may include various "adhesive foils". In exemplary embodiments, a protective layer may be formed on or over the workpiece by a dispenser and/or a spin coating process followed by a curing procedure.

Figure 12C:
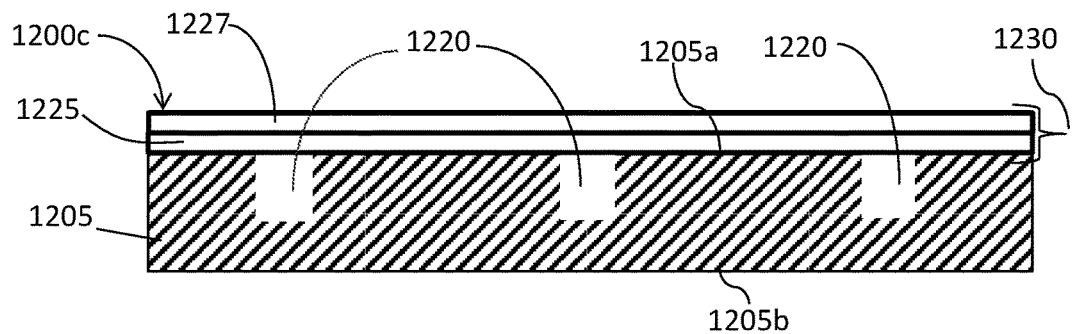

In the embodiment of FIG. 12C, a structure 1200c includes an adhesive structure 1230 formed on a first side 1205a of the workpiece 1205. In the example shown in FIG. 12C, the adhesive structure 1230 at least includes a foil 1225 with an adhesive 1227. In FIG. 12C the adhesive 1227 is shown on top of the foil 1225 wherein the foil may prevent the adhesive from seeping through the foil 1225, and may contact the first side 1205a of the workpiece 1205. Due to the foil 1225, only a very small portion of the adhesive 1227 may enter the trenches 1220 of the workpiece 1205, if at all. Thus, the foil 1225 may be considered as an example of a protective layer or film that may be configured to prevent adhesive (e.g. glue) from entering the trenches 1220. In at least one embodiment, the positions or locations of the adhesive 1227 and the foil 1225 may be reversed. In at least one embodiment, an adhesive may be disposed on both sides of the foil 1225.

In accordance with exemplary embodiments, other variations of adhesive structures may be used. Adhesive structures may include a single layer or may be multi-layered. In one example and as previously mentioned, the adhesive structure may just include an adhesive or adhesive layer or film. In another example, the adhesive structure may include a protective layer (e.g., a film, a foil, etc.) to protect the workpiece, wherein the protective layer (e.g., film, foil, etc.) may not have adhesive properties or characteristics, and in addition to the protective layer the adhesive structure may include an adhesive (e.g. glue) or adhesive layer or film that may be disposed on the protective layer and may serve to attach a carrier.

A multi-layered adhesive structure may include one or more protective layers and/or one or more adhesive layers. For example, an adhesive structure may include double-sided adhesion or in other words, a protective layer with at least one adhesive on over a front side and at least one adhesive on or over a back side, opposite the front side, of the protective layer. Of course, other variations of multi-layer adhesive structures can be realized. Additionally, the protective layers and/or adhesive layers of a multi-layer adhesive structure may differ from each other. In other words it is not necessary that all protective layers or all adhesive layers of an adhesive structure be the same.

Figure 12D:
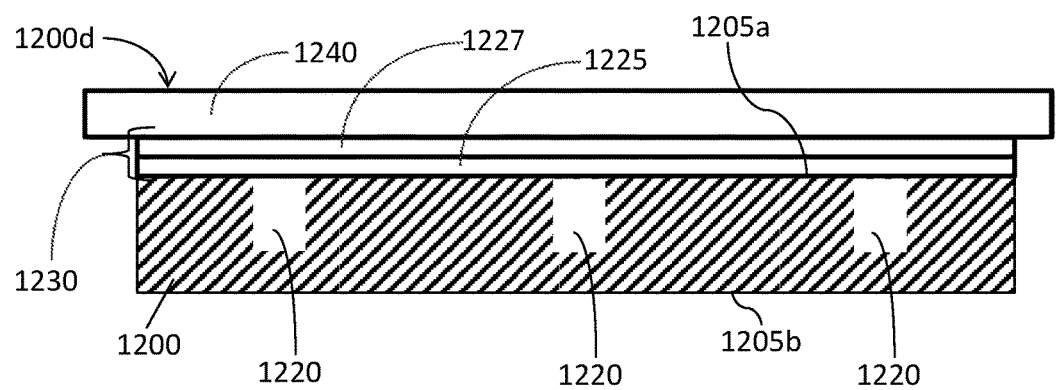

In FIG. 11, at 1120 the workpiece can be mounted to a carrier using the adhesive structure. For example the workpiece may attach to the carrier with the adhesive structure therebetween. The adhesive of the adhesive structure can bind the workpiece and the carrier together. In some exemplary embodiments, the carrier (as well as any carrier described herein) may include an adhesive located, for example, over or on the mounting surface of the carrier. The carrier adhesive may be used, for example, to supplement any adhesive of the adhesive structure for adequate adhesion of the carrier to the workpiece. The embodiment of FIG. 12D shows a structure 1200d including the workpiece 1205 after it has been mounted to a carrier 1240 via the adhesive structure 1230. The foil 1225 of the adhesive structure 1230 may prevent the adhesive 1227 from entering or excessively entering the trenches 1220 of the workpiece 1205.

Figure 12E:
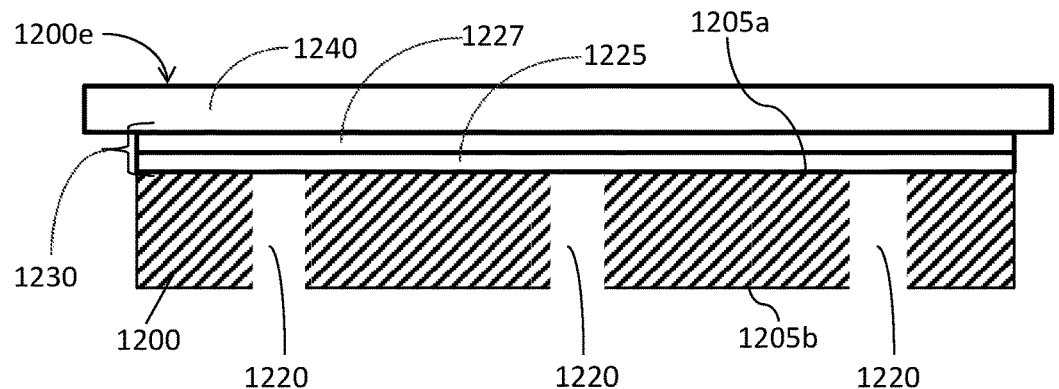

In FIG. 11, after mounting, the workpiece may be thinned from the second side so as to open the one or more trenches, at 1125. The workpiece or portion thereof can be thinned using any suitable method or technique, such as by grinding, in one example. Thinning the workpiece from the second side (e.g., backside) can open or extend the trenches through the workpiece from the first side to the second side. The embodiment of FIG. 12E shows the workpiece 1205 after it has been thinned from the second side 1205b and the trenches 1220 have been opened. In one or more embodiments, an implantation may be carried out from the second side 1205b. In other words, particles, e.g., ions (or dopants) may be implanted into the workpiece 1205 (e.g., backside implantation). In embodiments, the implantation may be carried out after the thinning but before applying a metallization layer. Alternatively or in addition, there may be one or more other processes that may be carried out.

After mounting and thinning the semiconductor workpiece may be further processed. For example, in FIG. 11 at 1130, a metallization layer may be formed over the second side of the workpiece after thinning. The metallization layer may also be formed at least partially in the trenches, such as on the trench sidewalls, for example.

In accordance with exemplary embodiments, the metallization layer can be formed using any suitable techniques or processes. For example, in an exemplary embodiment, a metallization layer can be formed through a metal sputtering deposition process. In other words, metal can be sputter deposited on the backside of the workpiece to form the metallization layer. In some embodiments, the workpiece, or portions thereof, may be cleaned prior to the metal sputter deposition.

Figure 12F:
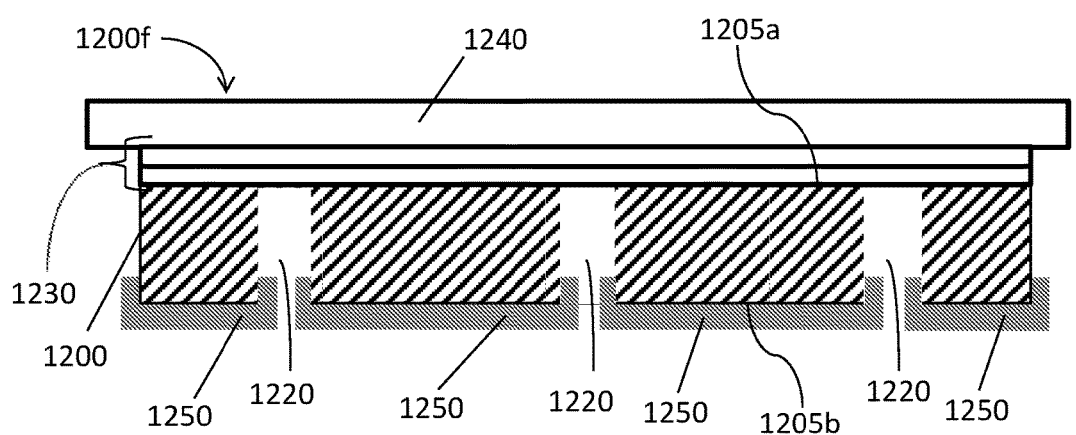

The embodiment of FIG. 12F shows a structure 1200f in which the mounted semiconductor workpiece 1205 includes a metallization layer 1250 formed on the second side 1205b of the workpiece 1205. As shown in FIG. 12F, the metallization layer 1250 is partially formed on the sidewalls of the one or more trenches 1220.

After forming the metallization layer, the workpiece may still be further processed. In exemplary embodiments, the semiconductor workpiece may be demounted from the carrier. Before demounting, the workpiece with the metallization layer may be laminated onto a tape.

In one exemplary embodiment the workpiece (e.g., devices or chips) can be mounted to an additional carrier. In this regard, the workpiece (e.g., devices or chips) can be mounted with the metallization layer to the additional carrier. The additional carrier may be, for example, a lead frame, or any other suitable carrier. Other implementable processes can include the deposition or addition of other materials, layers, elements, etc. to the workpiece.

In accordance with exemplary embodiments, any carrier, carrier layers described herein with respect to any embodiment can be made out of any suitable material including, for example, glass, graphite, acrylic glass (Poly(methyl methacrylate) (PMMA)), semiconductor material (e.g., silicon), and plastic, to a name a few.

In accordance with exemplary embodiments, any workpiece described herein may have a thickness in the range of about 200 μm to about 1000 μm, e.g., in the range of about 400 μm to about 800 μm, before thinning and/or a thickness in the range of about 5 μm to about 400 μm, e.g. in the range of about 10 μm to about 50 μm, after thinning, although other thicknesses may be possible as well.

In accordance with exemplary embodiments, the metallization layer may be a single layer. In accordance with exemplary embodiments, the metallization layer may be a layer stack including a plurality of sublayers, e.g. two, three, four, . . . , etc., sublayers. In accordance with exemplary embodiments, at least one sublayer of the plurality of sublayers may include or may be made of a different material than at least one other sublayer of the plurality of sublayers.

In accordance with exemplary embodiments, materials for the metallization layer may include any suitable metal or metal alloy.

One or more exemplary embodiments relate to a method for processing a semiconductor workpiece, the method including: providing a semiconductor workpiece having one or more kerf regions; etching the one or more kerf regions from a first side of the workpiece to form one or more trenches in the workpiece; mounting the workpiece with the first side to a carrier; thinning the workpiece from a second side of the workpiece so as to open the one or more trenches; and forming a metallization layer over the second side of the workpiece after thinning the workpiece.

In accordance with exemplary embodiments, etching the one or more kerf regions may include plasma etching the one or more kerf regions.

In accordance with exemplary embodiments, the method may further include implanting ions into the workpiece from the second side of the workpiece after thinning the workpiece and before forming the metallization layer.

In accordance with exemplary embodiments, forming the metallization layer includes sputter depositing the metallization layer.

In accordance with exemplary embodiments, the method further includes forming the metallization layer over at least a part of one or more sidewalls of the one or more trenches.

In accordance with exemplary embodiments, the method further includes demounting the carrier from the workpiece after forming the metallization layer.

In accordance with or more exemplary embodiments, the method further includes laminating the workpiece with the metallization layer onto a tape before demounting the carrier from the workpiece.

In accordance with exemplary embodiments, mounting the workpiece with the first side to the carrier includes depositing an adhesive over the first side of the workpiece and attaching the workpiece to the carrier by means of the adhesive.

In accordance with exemplary embodiments, the method further includes applying a foil to the first side of the workpiece before depositing the adhesive.

In accordance with exemplary embodiments, the foil is configured to withstand temperatures up to about 100° C., e.g. up to about 200° C., e.g. up to about 300° C., e.g. up to about 400° C., e.g. up to about 1000° C., or even higher temperatures, e.g. temperatures in the range from about −100° C. up to about 400° C.

In accordance with exemplary embodiments, the second side of the workpiece is opposite the first side of the workpiece.

In accordance with exemplary embodiments, the semiconductor workpiece includes a wafer.

In accordance with exemplary embodiments, the first side is a front side of the wafer and the second side is a back side of the wafer.

In accordance with exemplary embodiments, the carrier is configured as a rigid carrier.

In accordance with exemplary embodiments, the carrier includes glass.

In accordance with exemplary embodiments, the carrier includes silicon.

In accordance with exemplary embodiments, the carrier includes acrylic glass (Poly(methyl methacrylate) (PMMA)).

In accordance with exemplary embodiments, thinning the workpiece includes grinding the workpiece.

In accordance with exemplary embodiments, the method further includes polishing the workpiece from the second side of the workpiece after thinning the workpiece.

One or more exemplary embodiments relate to a method for processing a semiconductor workpiece, the method including: providing a semiconductor workpiece having one or more kerf regions; forming a first mask layer over a first side of the workpiece; patterning the first mask layer to expose the one or more kerf regions; mounting the workpiece with the patterned first mask layer to a carrier; forming a second mask layer over a second side of the workpiece; patterning the second mask layer to expose the one or more kerf regions; etching the one or more kerf regions from the second side of the workpiece to form one or more trenches in the workpiece extending from the second side to the first side of the workpiece; and forming a metallization layer over the second side of the workpiece after etching the one or more kerf regions.

In accordance with exemplary embodiments, etching the one or more kerf regions from the second side of the workpiece includes plasma etching the one or more kerf regions from the second side of the workpiece.

In accordance with exemplary embodiments, the method further includes thinning the workpiece from the second side after mounting the workpiece and before etching the one or more kerf regions.

In accordance with exemplary embodiments, forming the metallization layer includes sputter depositing the metallization layer.

In accordance with exemplary embodiments, the method further includes forming the metallization layer over at least a part of one or more sidewalls of the one or more trenches.

In accordance with exemplary embodiments, the method further includes demounting the carrier from the workpiece after forming the metallization layer.

In accordance with exemplary embodiments, the method further includes laminating the workpiece with the metallization layer onto a tape before demounting the carrier from the workpiece.

In accordance with exemplary embodiments, the second side of the workpiece is opposite the first side of the workpiece.

In accordance with exemplary embodiments, the semiconductor workpiece includes a wafer.

In accordance with exemplary embodiments, the first side is a front side of the wafer and the second side is a back side of the wafer.

In accordance with exemplary embodiments, at least one of the first and second mask layers includes a hard mask material.

In accordance with exemplary embodiments, at least one of the first and second mask layers is an oxide layer.

In accordance with exemplary embodiments, thinning the workpiece includes grinding the workpiece.

One or more exemplary embodiments relate to a method for processing a semiconductor workpiece, the method including: providing a semiconductor workpiece having one or more kerf regions; forming a first mask layer over a first side of the workpiece; patterning the first mask layer to expose the one or more kerf regions; mounting the workpiece with the patterned first mask layer to a carrier; forming a second mask layer over a second side of the workpiece; patterning the second mask layer to expose one or more regions of the workpiece adjacent to the one or more kerf regions; forming a metallization layer over the patterned second mask layer and the one or more exposed regions of the workpiece adjacent to the one or more kerf regions; applying a lift-off process to remove the patterned second mask layer and the metallization layer from the one or more kerf regions and form a patterned metallization layer; and etching the one or more kerf regions from the second side of the workpiece to form one or more trenches in the workpiece extending from the second side to the first side of the workpiece.

In accordance with exemplary embodiments, etching the one or more kerf regions from the second side of the workpiece includes plasma etching the one or more kerf regions from the second side of the workpiece.

In accordance with exemplary embodiments, the method further includes thinning the workpiece from the second side before forming the second mask layer.

In accordance with exemplary embodiments, the method further includes forming a protection layer over the patterned metallization layer before etching the one or more kerf regions.

In accordance with exemplary embodiments, the method further includes demounting the carrier after etching the one or more kerf regions.

In accordance with exemplary embodiments, the method further includes laminating the workpiece with the metallization layer onto a tape after etching the one or more kerf regions and before demounting the carrier from the workpiece.

In accordance with exemplary embodiments, forming the metallization layer includes sputter depositing the metallization layer.

In accordance with exemplary embodiments, thinning the workpiece includes grinding the workpiece.

One or more exemplary embodiments relate to a method for processing a semiconductor workpiece, the method including: providing a semiconductor workpiece having one or more kerf regions; forming a mask layer over a first side of the workpiece; patterning the mask layer to expose the one or more kerf regions; mounting the workpiece with the patterned mask layer to a carrier; forming a metallization layer over a second side of the workpiece that is opposite the first side; patterning the metallization layer to expose the one or more kerf regions; etching the one or more kerf regions from the second side of the workpiece to form one or more trenches in the workpiece extending from the second side to the first side of the workpiece.

In accordance with exemplary embodiments, etching the one or more kerf regions from the second side of the workpiece includes plasma etching the one or more kerf regions from the second side of the workpiece.

In accordance with exemplary embodiments, the method further includes thinning the workpiece from the second side before forming the metallization layer over the second side.

In accordance with exemplary embodiments, the method further includes demounting the carrier after etching the one or more kerf regions.

In accordance with exemplary embodiments, the method further includes laminating the workpiece with the patterned metallization layer onto a tape after etching the one or more kerf regions and before demounting the carrier.

In accordance with exemplary embodiments, forming the metallization layer includes sputter depositing the metallization layer.

In accordance with exemplary embodiments, the mask layer includes a hard mask material.

In accordance with exemplary embodiments, the mask layer is an oxide layer.

In accordance with exemplary embodiments, patterning the metallization layer includes: forming a second mask layer over a side of the metallization layer facing away from the workpiece, patterning the second mask layer to expose one or more regions of the metallization layer disposed over the one or more kerf regions; and etching the exposed one or more regions of the metallization layer.

In accordance with exemplary embodiments, etching the exposed one or more regions of the metallization layer includes at least one of a wet chemical etch process and a dry etch process.

In accordance with exemplary embodiments, the carrier is configured as a rigid carrier.

In accordance with exemplary embodiments, the carrier includes glass.

In accordance with exemplary embodiments, the carrier includes silicon.

One or more exemplary embodiments relate to a method for processing a semiconductor workpiece, the method including: providing a semiconductor workpiece having one or more kerf regions; forming an etch stop layer over a first side of the workpiece; mounting the workpiece with the etch stop layer attached to a carrier; etching the one or more kerf regions from a second side of the workpiece to the etch stop layer to form one or more trenches in the workpiece; and removing one or more sections of the etch stop layer exposed by the one or more trenches, to extend the one or more trenches through to a surface of the etch stop layer facing the carrier.

In accordance with exemplary embodiments, etching the one or more kerf regions includes plasma etching the one or more kerf regions.

In accordance with exemplary embodiments, the method further includes thinning the workpiece from the second side before etching the one or more kerf regions from the second side.

In accordance with exemplary embodiments, thinning the workpiece includes grinding the workpiece.

In accordance with exemplary embodiments, thinning the workpiece includes chemical mechanical polishing of the workpiece.

In accordance with exemplary embodiments, the method further includes forming a metallization layer over the second side of the workpiece after etching the one or more kerf regions.

In accordance with exemplary embodiments, the method further includes forming a metallization layer over the second side of the workpiece after removing the one or more sections of the etch stop layer.

In accordance with exemplary embodiments, the etch stop layer comprises a dielectric material.

In accordance with exemplary embodiments, the etch stop layer is an oxide layer.

In accordance with exemplary embodiments, removing the one or more sections of the etch stop layer includes etching the etch stop layer.

In accordance with exemplary embodiments, etching the etch stop layer includes dry etching the etch stop layer.

In accordance with exemplary embodiments, the semiconductor workpiece includes a semiconductor wafer.

In accordance with exemplary embodiments, the first side is a front side of the wafer and the second side is a back side of the wafer.

In accordance with exemplary embodiments, forming the metallization layer includes sputter depositing the metallization layer.

In accordance with exemplary embodiments, the method further includes forming the metallization layer over one or more sidewalls of the one or more trenches.

In accordance with exemplary embodiments, the method further includes demounting the carrier after forming the metallization layer.

One or more exemplary embodiments relate to a method for processing a semiconductor workpiece, the method including: providing a semiconductor workpiece having one or more kerf regions; removing material of the one or more kerf regions from a first side of the workpiece to form one or more trenches in the workpiece; forming an adhesive structure over the first side of the workpiece, wherein the adhesive structure at most partially fills the one or more trenches; mounting the workpiece to a carrier using the adhesive structure; thinning the workpiece from a second side of the workpiece so as to open the one or more trenches; and forming a metallization layer over the second side of the workpiece after thinning the workpiece.

In accordance with exemplary embodiments, removing material of the one or more kerf regions from the first side of the workpiece includes etching the one or more kerf regions from the first side of the workpiece.

In accordance with exemplary embodiments, etching the one or more kerf regions includes plasma etching the one or more kerf regions.

In accordance with exemplary embodiments, removing material of the one or more kerf regions from the first side of the workpiece includes sawing the one or more kerf regions from the first side of the workpiece.

In accordance with exemplary embodiments, the adhesive structure includes a protective layer disposed over the first side of the workpiece and an adhesive layer disposed over the protective layer.

In accordance with exemplary embodiments, the protective layer is a foil.

In accordance with exemplary embodiments, the foil is configured to withstand temperatures up to about 100° C., e.g. up to about 200° C., e.g. up to about 300° C., e.g. up to about 400° C., e.g. up to about 1000° C., or even higher temperatures, e.g. temperatures in the range from about −100° C. up to about 400° C.

In accordance with exemplary embodiments, the method further includes implanting ions into the workpiece from the second side of the workpiece after thinning the workpiece and before forming the metallization layer.

In accordance with exemplary embodiments, the method further includes demounting the carrier from the workpiece after forming the metallization layer.

In accordance with exemplary embodiments, the method further includes laminating the workpiece with the metallization layer onto a tape before demounting the carrier from the workpiece.

In accordance with exemplary embodiments, forming the metallization layer includes sputter depositing the metallization layer.

In accordance with exemplary embodiments, the method further includes forming the metallization layer over at least a part of one or more sidewalls of the one or more trenches.

In accordance with exemplary embodiments, the plasma etching includes applying a plasma etchant made of a gaseous halogen containing compound, e.g. at least one compound selected from the group consisting of: $CF_4$, $SF_6$, $NF_3$, HCl, HBr, $SiF_4$.

One or more exemplary embodiments relate to a process/method for dicing before grinding (DBG) with subsequent backside metallization The method may be achieved, at least in part, by applying glue onto a mechanically stable carrier (e.g., glass, silicon, etc.). To protect a scribe line against penetration of the glue during mounting to the carrier, a foil or the like can be beforehand applied to a wafer. As a result, advantages such as mechanical stability and other benefits from the DBG process can be realized for subsequent processing after chip singulation. An exemplary method for processing a semiconductor workpiece can include sawing/etching/etc. a side (e.g., front side) of a wafer; applying a foil to the wafer using e.g., a temperature resistant foil; mounting the wafer with the applied foil onto a carrier (e.g., glass carrier); grinding, and if necessary, polishing and/or plasma damage etching; implementing one more back side processes (e.g., metallization); and removing the carrier system on tape-and-frame.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for processing a semiconductor workpiece, the method comprising:
    providing a semiconductor workpiece having one or more kerf regions;
    forming a first mask layer over a first side of the workpiece, wherein the first mask layer comprises hard mask material;
    patterning the first mask layer to expose the one or more kerf regions;
    mounting the workpiece with the patterned first mask layer to a carrier;
    forming a second mask layer over a second side of the workpiece;
    patterning the second mask layer to expose the one or more kerf regions;
    etching the one or more kerf regions from the second side of the workpiece to form one or more trenches in the workpiece extending from the second side to the first side of the workpiece, the one or more trenches defining a plurality of sidewalls of the workpiece extending from the first side to the second side of the workpiece;
    forming a metallization layer on the second side of the workpiece and on at least one sidewall of the workpiece formed by one or more trenches after etching the one or more kerf regions, wherein the metallization layer extends on the at least one sidewall from the first side to the second side of the workpiece; and
    removing the patterned first mask layer from the workpiece.

2. The method of claim 1, wherein etching the one or more kerf regions from the second side of the workpiece comprises plasma etching the one or more kerf regions from the second side of the workpiece.

3. The method of claim 1, further comprising thinning the workpiece from the second side after mounting the workpiece and before etching the one or more kerf regions.

4. The method of claim 3, wherein thinning the workpiece comprises grinding the workpiece.

5. The method of claim 1, wherein forming the metallization layer comprises sputter depositing the metallization layer.

6. The method of claim 1, further comprising demounting the carrier from the workpiece after forming the metallization layer.

7. The method of claim 6, further comprising laminating the workpiece with the metallization layer onto a tape before demounting the carrier from the workpiece.

8. The method of claim 1, wherein the second side of the workpiece is opposite the first side of the workpiece.

9. The method of claim 1, wherein the semiconductor workpiece comprises a wafer.

10. The method of claim 1, wherein the first side is a front side of the wafer and the second side is a back side of the wafer.

11. The method of claim 1, wherein the second mask layer includes a hard mask material.

12. The method of claim 1, wherein the second mask layer comprises an oxide layer.

13. The method of claim 1, wherein the first mask layer comprises an oxide layer.

14. The method of claim 1, wherein the first mask layer is removed after forming the metallization layer.

15. The method of claim 1, wherein the carrier is a rigid carrier.

16. A method for processing a semiconductor workpiece, the method comprising:
providing a semiconductor workpiece having one or more kerf regions;
forming a first mask layer over a first side of the workpiece;
patterning the first mask layer to expose the one or more kerf regions;
mounting the workpiece with the patterned first mask layer to a carrier, comprising applying an adhesive to bond the workpiece to the carrier, the adhesive comprising different material than the first mask layer;
forming a second mask layer over a second side of the workpiece;
patterning the second mask layer to expose the one or more kerf regions;
etching the one or more kerf regions from the second side of the workpiece to form one or more trenches in the workpiece extending from the second side to the first side of the workpiece, the one or more trenches defining a plurality of sidewalls of the workpiece that extend from the first side to the second side of the workpiece;
forming a metallization layer on the second side of the workpiece and on at least one sidewall of the workpiece formed by the one or more trenches after etching the one or more kerf regions, wherein the metallization layer extends on the at least one sidewall from the first side to the second side of the workpiece; and
removing the patterned first mask layer from the workpiece.

17. The method of claim 16, wherein the adhesive is a continuous adhesive layer.

* * * * *